United States Patent
Iwamoto et al.

(10) Patent No.: US 7,629,863 B2
(45) Date of Patent: Dec. 8, 2009

(54) FILTER AND DUPLEXER

(75) Inventors: Yasuhide Iwamoto, Kawasaki (JP);
Shogo Inoue, Kawasaki (JP); Masanori Ueda, Kawasaki (JP); Seiichi Mitobe, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 225 days.

(21) Appl. No.: 11/798,927

(22) Filed: May 17, 2007

(65) Prior Publication Data

US 2007/0268091 A1 Nov. 22, 2007

(30) Foreign Application Priority Data

May 18, 2006 (JP) .............................. 2006-139597

(51) Int. Cl.
*H03H 9/64* (2006.01)
*H03H 9/205* (2006.01)

(52) U.S. Cl. ........................................ 333/133; 333/195
(58) Field of Classification Search ................. 333/133, 333/186, 193, 194, 195, 196
See application file for complete search history.

(56) References Cited

U.S. PATENT DOCUMENTS

| | | | |
|---|---|---|---|
| 6,943,645 B2 * | 9/2005 | Taniguchi | 333/133 |
| 6,995,631 B2 * | 2/2006 | Taniguchi | 333/133 |
| 7,253,702 B2 * | 8/2007 | Kemmochi et al. | 333/133 |
| 7,479,850 B2 * | 1/2009 | Kearns et al. | 333/189 |
| 2002/0140520 A1 | 10/2002 | Hikita et al. | |
| 2004/0032706 A1 | 2/2004 | Kemmochi et al. | |
| 2004/0140866 A1 | 7/2004 | Taniguchi | |
| 2006/0055485 A1 | 3/2006 | Lobeek | |
| 2007/0030094 A1 | 2/2007 | Omote | |

FOREIGN PATENT DOCUMENTS

| | | |
|---|---|---|
| JP | 08-18393 | 1/1996 |
| JP | 2002-359542 A | 12/2002 |
| JP | 2003-069382 A | 3/2003 |
| JP | 2003-332885 | 11/2003 |
| JP | 2004-080233 A | 3/2004 |
| JP | 2004-135322 | 4/2004 |
| KR | 10-2004-0066036 A | 7/2004 |
| KR | 10-2005-0075433 A | 7/2005 |
| WO | WO 02/37709 A1 | 5/2002 |
| WO | WO 2006/016544 A1 | 2/2006 |

* cited by examiner

*Primary Examiner*—Dean O Takaoka
(74) *Attorney, Agent, or Firm*—Arent Fox LLP

(57) ABSTRACT

A duplexer includes: a first filter that is connected to a common terminal and a first terminal, and includes a first series-arm resonator; a second filter that is connected to the common terminal and a second terminal; a first inductor that is connected in parallel to the first series-arm resonator; a mounting unit that has the first filter and the second filter mounted thereon; a first inductor line that is provided on the mounting unit, and connects the first inductor and the first series-arm resonator; and a first terminal line that is provided on the mounting unit, and connects the first filter and the first terminal. In this duplexer, the directions of currents flowing through the first inductor line and the first terminal line cross each other.

21 Claims, 29 Drawing Sheets

FILTER AND DUPLEXER

BACKGROUND OF THE INVENTION

1. Field of the Invention

The present invention generally relates to a filter and a duplexer, and more particularly, to a filter and a duplexer that are mounted on a mounting unit.

2. Description of the Related Art

As mobile communication systems have been developed dramatically in recent years, portable telephone devices, portable information terminals, and the likes have rapidly spread, and such terminals with smaller sizes and higher performances are being developed. Also, analog systems and digital systems are both used in portable telephone systems, and the frequencies mostly used are in the 800 MHz to 1 GHz band and the 1.5 GHz to 2.0 GHz band. Antenna duplexers utilizing surface acoustic wave filters or piezoelectric thin-film filters have also been developed for the use in those devices designed for mobile communications.

In the recent development of portable telephone devices, the performances of the terminals have been improved by employing the dual mode (a combination of an analog system and a digital system or a combination of the digital TDMA (time division multiple access) and CDMA (code division modulation access)), or the dual band (a combined use of the 800 MHz band and the 1.9 GHz band, or the 900 MHz band and the 1.8 GHz band or the 1.5 GHz band), as a variety of systems have been developed. The components (filters) to be used in those terminals are expected to have more sophisticated functions.

As well as sophisticated functions, smaller and less expensive devices are expected. Many antenna duplexers to be used in multi-functional terminals are formed with dielectrics, with complex duplexers utilizing surface acoustic waves and including dielectrics at least on one side, or only with surface acoustic wave devices.

A dielectric duplexer is large in size, and with a dielectric duplexer, it is very difficult to produce a small-sized or thin portable terminal. Also, where a surface acoustic wave device is used on one side, it is difficult to produce a small-sized or thin device, due to the size of the dielectric device. Among duplexer devices using conventional surface acoustic wave filters, there are devices of a module type that have a transmission filter, a reception filter, and a matching circuit mounted on a printed board independently of one another, and devices of an integrated type that have transmission and reception filter chips mounted in a multilayer ceramic package and a matching circuit mounted in a package. Each of those devices is ⅓ to ⅟₁₅ of a dielectric duplexer in volume, and is ½ to ⅓ of a dielectric duplexer in thickness when seen in the height direction. Japanese Unexamined Patent Publication No. 8-18393 discloses a filter and duplexer that have a filter chip mounted on a mounting unit that is a stacked package having ceramic substrates stacked or is a stacked substrate or the like.

Japanese Unexamined Patent Publication Nos. 2004-135322 and 2003-332885 disclose the technique of connecting an inductor in parallel to a series-arm resonator of a ladder filter or a duplexer utilizing the ladder filter. As an inductor is connected in parallel to a series-arm resonator, an attenuation pole can be formed adjacent to the pass band of the filter, and the suppression characteristics can be improved.

Where a filter chip having an inductor connected in parallel to a series-arm resonator is mounted on a mounting unit, and the size is made smaller accordingly, the mutual inductance between signal lines needs to be made lower so as to achieve a higher degree of suppression.

SUMMARY OF THE INVENTION

It is therefore an object of the present invention to provide a filter and a duplexer in which the above disadvantage is eliminated.

A more specific object of the present invention is to provide a filter and a duplexer that can reduce the mutual inductance between signal lines, and have a high degree of suppression in the stop band, even if the size is made smaller.

According to an aspect of the present invention, there is provided a duplexer including: a first filter that is connected to a common terminal and a first terminal, and includes a first series-arm resonator; a second filter that is connected to the common terminal and a second terminal; a first inductor that is connected in parallel to the first series-arm resonator; a mounting unit that has the first filter and the second filter mounted thereon; a first inductor line that is provided on the mounting unit, and connects the first inductor and the first series-arm resonator; and a first terminal line that is provided on the mounting unit, and connects the first filter and the first terminal, the first inductor line and the first terminal line having currents flowing in directions that cross each other.

According to another aspect of the present invention, there is provided a filter including: a series-arm resonator that is connected between a first input/output terminal and a second input/output; an inductor that is connected in parallel to the series-arm resonator; a mounting unit that has the series-arm resonator mounted thereon; an inductor line that is provided on the mounting unit, and connects the inductor and the series-arm resonator; and a second line that is provided on the mounting unit, and connects the series-arm resonator and the second input/output terminal, wherein the inductor line and the second line have currents flowing in directions that cross each other.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of embodiments of the present invention, with reference to the accompanying drawings.

First Embodiment

Figure 1:
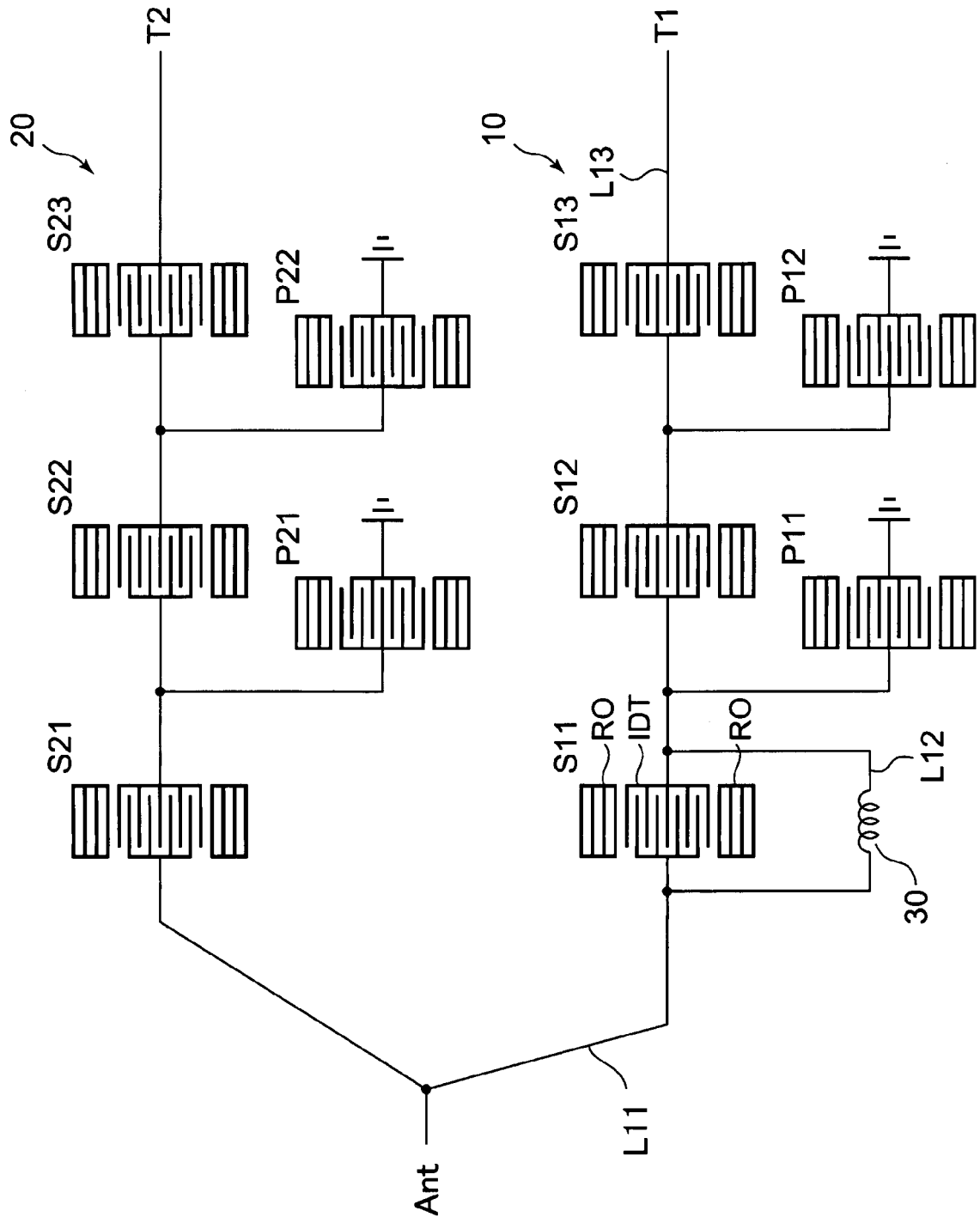
FIG. 1 is a circuit diagram of a duplexer in accordance with a first embodiment of the present invention.

A first embodiment of the present invention is an example where a duplexer for 2-GHz band W-CDMA systems having ladder filters is mounted on a stacked package. In this embodiment, a first filter 10 having a first inductor 30 connected in parallel to series-arm resonators serves as a reception filter, and a second filter 20 serves as a transmission filter. FIG. 1 is a circuit diagram of a duplexer in accordance with the first embodiment. As shown in FIG. 1, the first filter 10 (a reception filter) is connected between a common terminal Ant (an antenna terminal) and a first terminal T1 (a reception terminal). The second filter 20 (a transmission filter) is connected between the common terminal Ant and a second terminal T2 (a transmission terminal). The first filter 10 is a ladder filter, and includes series-arm resonators S11 through S13 and parallel-arm resonators P11 and P12. The second filter 20 is also a ladder filter, and includes series-arm resonators S21 through S23, and parallel-arm resonators P21 and P22. The series-arm resonators S11 through S23 and the parallel-arm resonators P11 through P22 are surface acoustic wave resonators. For example, each of the series-arm resonators S11 through S23 and the parallel-arm resonators P11 and P22 has an interdigital transducer IDT on the surface of a piezoelectric substrate such as a 42-degree Y-cut X-propagation $LiTaO_3$ substrate, and a reflector RO on either side of the IDT.

In the first filter 10, the first inductor 30 is connected in parallel to the series-arm resonator S11 (the first series-arm resonator) located closest to the common terminal Ant. The first inductor 30 forms an attenuation pole in the transmission band, so as to improve the suppression properties of the first filter 10 in the transmission band. The first inductor 30 also functions as a matching circuit. Accordingly, the impedance of the first filter 10 seen from the common terminal Ant is increased in the transmission band. In this manner, the power of transmission signals can be prevented from entering the first filter 10.

In the first embodiment, the common terminal Ant and the first filter 10 are connected with a common line L11, the first inductor 30 and the series-arm resonator S11 are connected with a first inductor line L12, and the first filter 10 and the first terminal T1 are connected with a first terminal line T13.

Figure 2:
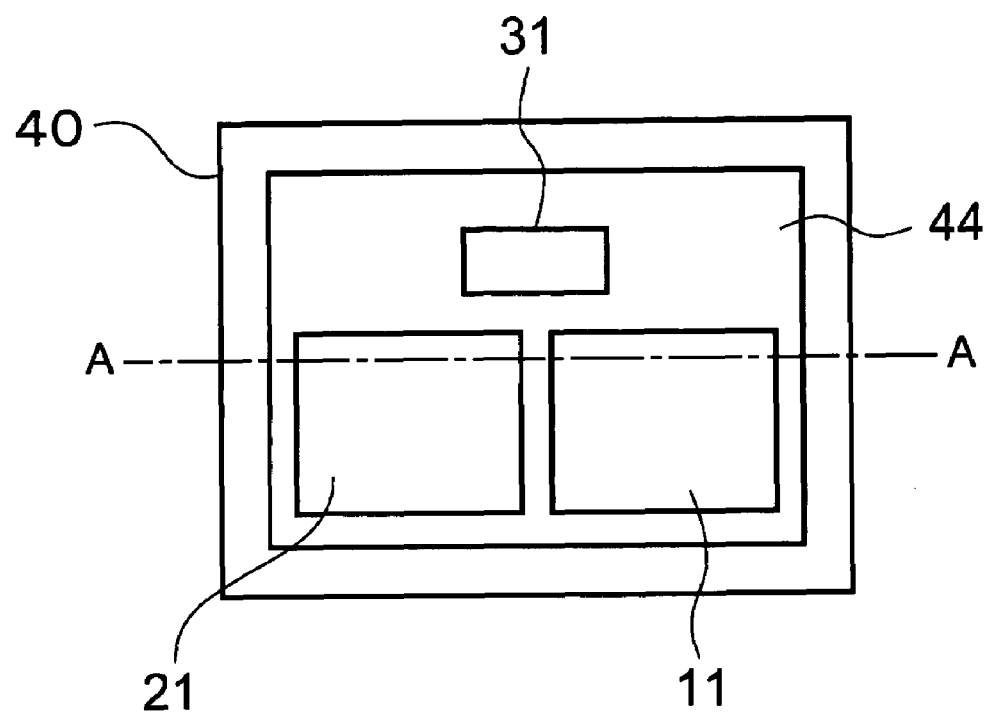
FIG. 2 is a top view of the duplexer in accordance with the first embodiment (the cap is not shown)
Figure 3:
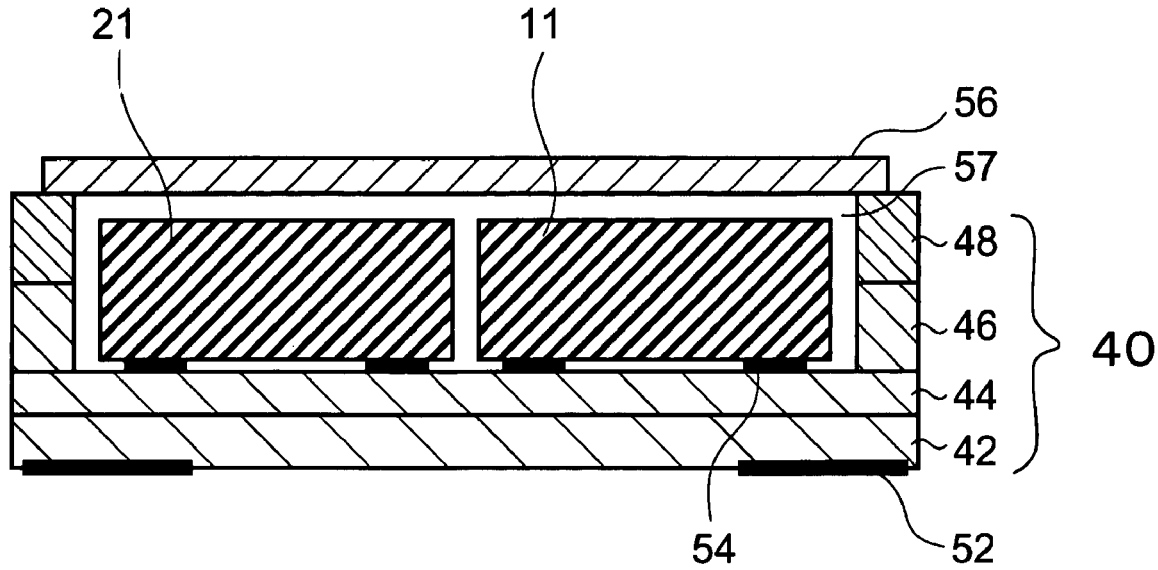
FIG. 3 is a cross-sectional view of the duplexer, taken along the line A-A of FIG. 2.

FIG. 2 is a top view of the stacked package 40 of the duplexer in accordance with the first embodiment, with a cap 56 being removed. FIG. 3 is a cross-sectional view of the stacked package 40, taken along the line A-A of FIG. 2. As shown in FIG. 2, a first filter chip 11, a second filter chip 21, and an inductor chip 31 are face-down mounted on a die-attach layer 44 of the stacked package 40. The series-arm resonators S11 through S13 and the parallel-arm resonators P11 and P12 of the first filter 10 are formed in the first filter chip 11. The series-arm resonators S21 through S23 and the parallel-arm resonators P21 and P22 of the second filter 20 are formed in the second filter chip 21. The first inductor 30 is formed in the inductor chip 31. The external size of the stacked package 40 is approximately 3×2.5×0.9 mm, which is much smaller than a typical conventional size that is approximately 3.8×3.8×1.5 mm.

Figure 4:
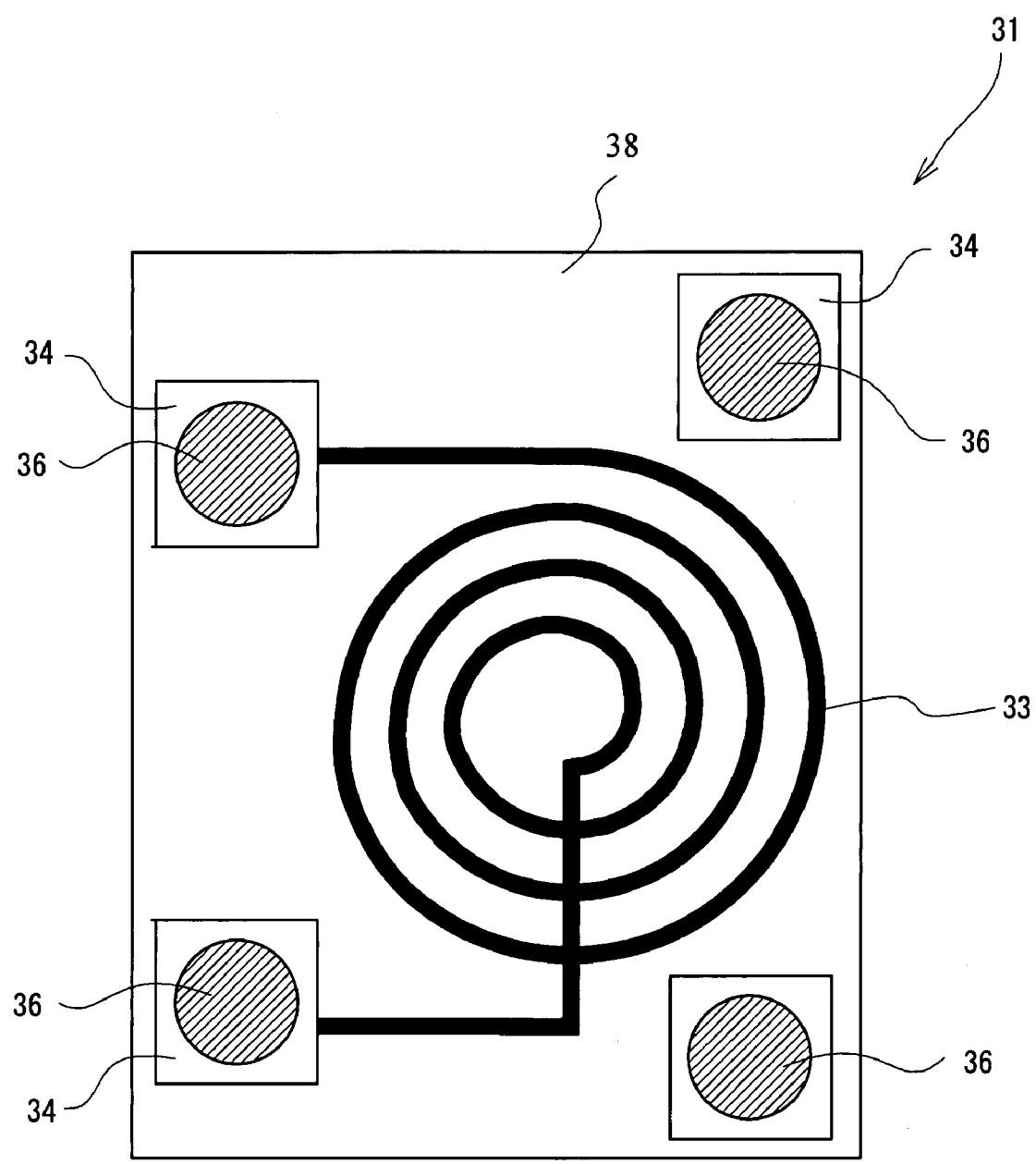
FIG. 4 shows an example case where an IPD is used for the inductor.

As shown in FIG. 4, the inductor chip 31 as an integrated passive device (IPD) is formed with a conductive spiral pattern 33 and pads 34 connected to the spiral pattern 33 on an insulating substrate or a semiconductor substrate 38. A bump 36 is formed on each of the pads 34. The inductor chip 31 may be a chip inductor.

As shown in FIG. 3, the stacked package 40 is formed with stacked layers. The stacked layers include a cap mounting layer 48, a cavity layer 46, the die-attach layer 44, and a line pattern/foot pad layer 42. The cap mounting layer 48 and the cavity layer 46 form a cavity 57 that houses the chips 11, 21, and 31. The cap 56 is placed on the cap mounting layer 48, so as to contain the chips 11, 21, and 31 inside the cavity 57. The chips 11, 21, and 31 are mounted onto the surface of the die-attach layer 44 with bumps 54 (such as soldering bumps). Foot pads 52 are formed under the bottom face of the line pattern/foot pad layer 42. Each of the stacked layers is made of an insulating material such as ceramics, and line patterns and conductive patterns such as vias that will be described later are formed. The conductive pattern may be formed with an alloy containing Al as a base (Al—Cu or Al—Mg, for example), or a multilayer film made of the alloy (Al—Cu/Cu/Al—Cu, Al/Cu/Al, Al/Mg/Al, Al—Mg/Mg/Al—Mg, for example). The insulating materials of each stacked layer may be alumina ceramics, glass ceramics, or an organic substrate, for example.

Figure 5:
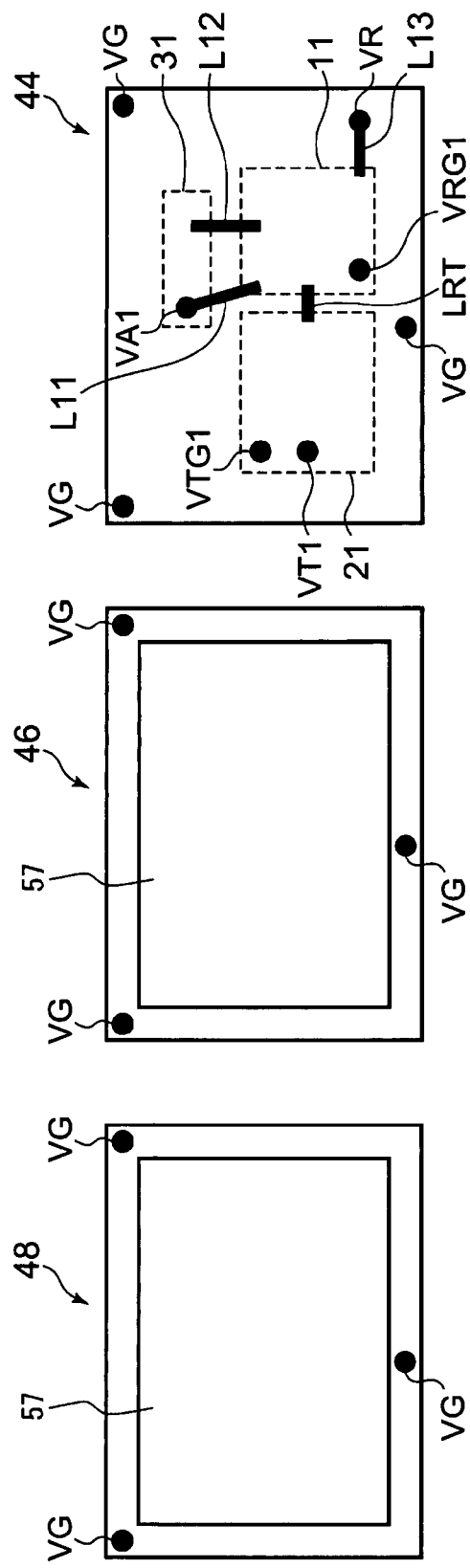
FIGS. 5A through 5E show the respective layers of the stacked package.

Referring now to FIGS. 5A through 5E, the structure of each layer of the stacked package 40 is described. In the drawings, the pattern shown in black is the conductive pattern. As shown in FIG. 5A, a cavity to be the cavity 57 is formed in the cap mounting layer 48, and the conductive cap 56 (not shown) is placed over the cavity. As shown in FIG. 5B, a cavity to form the cavity 57 is formed in the cavity layer 46. The vias VG shown in FIGS. 5A through 5D connect ground foot pads FG that are the ground terminals under the bottom face of the line pattern/foot pad layer 42 shown in FIG. 5E to the cap 56.

As shown in FIG. 5C, the line patterns formed with a conductive material such as a metal and the conductive pattern such as vias having conductors embedded therein are formed on the surface of the die-attach layer 44. The pads of each chip are electrically connected to the line patterns formed on the surface of the die-attach layer 44 with the bumps 54. The vias penetrate each stacked layer, and each of the vias is filled with a conductive material such as a metal. The line patterns are conductive patterns for connecting bumps or vias to one another. The first filter chip 11, the second filter chip 21, and the inductor chip 31 mounted on the surface of the die-attach layer 44 are indicated by dotted lines. As shown in FIG. 5D, line patterns and vias are formed on the upper face of the line pattern/foot pad layer 42, as on the surface of the die-attach layer 44. As shown in FIG. 5E, foot pads made of a conductive material are formed on the bottom face of the line pattern/foot pad layer 42.

Figure 6:
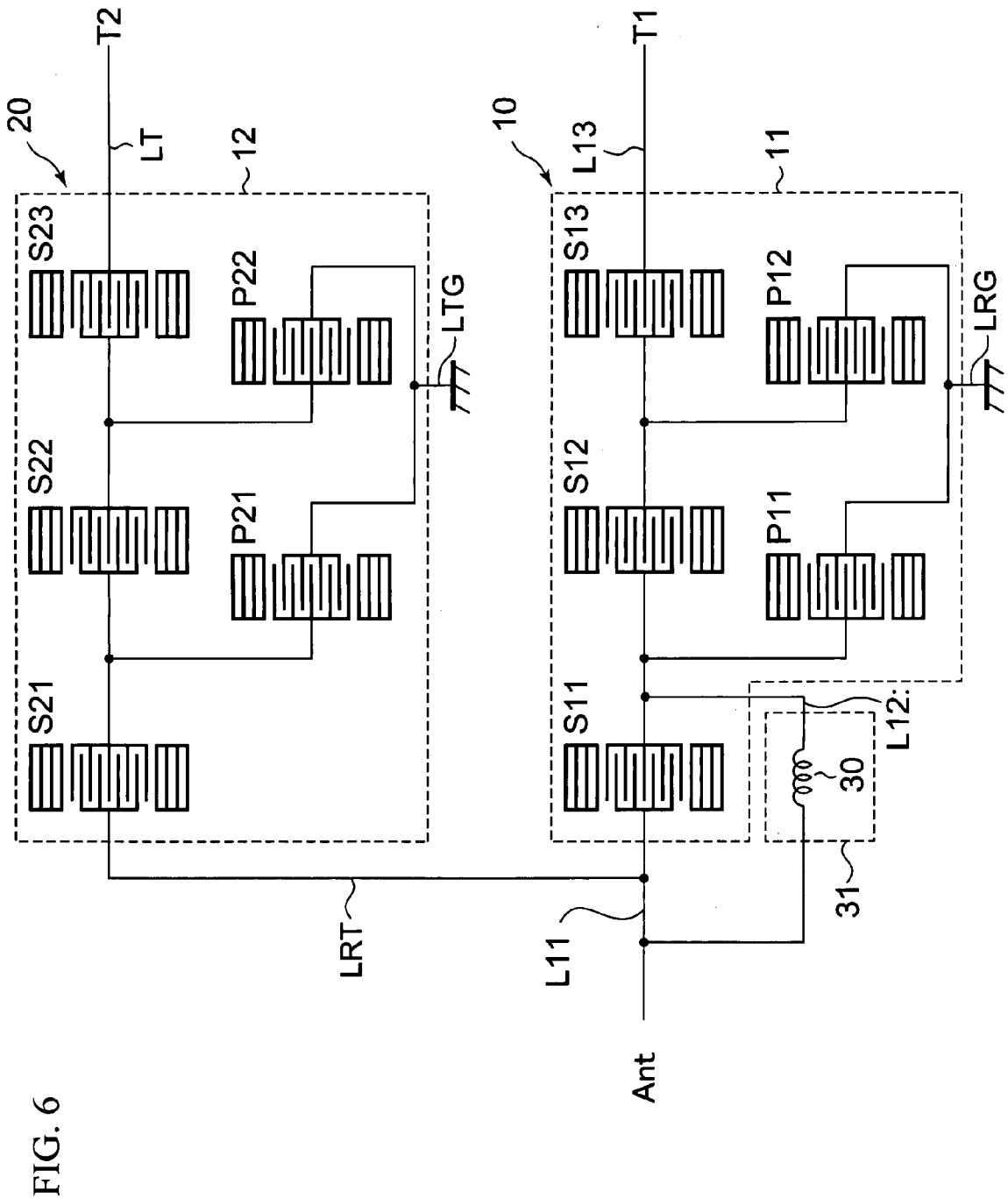
FIG. 6 is a circuit diagram of the duplexer in accordance with the first embodiment, showing the line patterns of the stacked package.

FIG. 6 illustrates the correspondence between the circuit diagram and FIGS. 5C through 5E. As shown in FIGS. 5C through 5E and FIG. 6, a common terminal foot pad FA that is the common terminal Ant is connected to an end of the first inductor 30 formed in the inductor chip 31 via a via VA2 and a line pattern LA formed on the line pattern/foot pad layer 42 and the a VA1 formed on the die-attach layer 44. The via VA1 is connected to the series-arm resonator S11 of the first filter 10 formed in the first filter chip 11 via the common line L11. The other end of the first inductor 30 is connected between the series-arm resonators S11 and S12 of the first filter 10 formed in the first filter chip 11 via the first inductor line L12. With this arrangement, the first inductor 30 is connected in parallel to the series-arm resonator S11.

A reception foot pad FR that is the first terminal T1 is connected to the series-arm resonator S13 of the first filter 10 via a via VR and a first terminal line L13 formed on the line pattern/foot pad layer 42 and the die-attach layer 44. The parallel-arm resonators P11 and P12 of the first filter 10 are short-circuited on the ground side in the first filter chip 11, and are connected to ground foot pads FG via a via VRG1 formed on the die-attach layer 44, a line pattern LRG and a via VRG2 formed on the line pattern/foot pad layer 42.

The first filter 10 and the second filter 20 are connected to each other on the common terminal Ant side via a line pattern LRT formed on the surface of the die-attach layer 44. A transmission foot pad FT that is the second terminal T2 is connected to the series-arm resonator S23 of the second filter 20 via a via VT2 and a line pattern LT formed on the line pattern/foot pad layer 42 and a via VT1 formed on the die-attach layer 44. The parallel-arm resonators P21 and P22 of the second filter 20 are short-circuited on the ground side in the second filter chip 21, and are connected to the ground foot pads FG via a via VTG1 formed on the die-attach layer 44 and a line pattern LTG and a via VTG2 formed on the line pattern/foot pad layer 42.

In this manner, the first filter 10 formed in the first filter chip 11, the second filter 20 formed in the second filter chip 21, and the first inductor 30 formed in the inductor chip 31 are connected to one another.

Figure 7A:
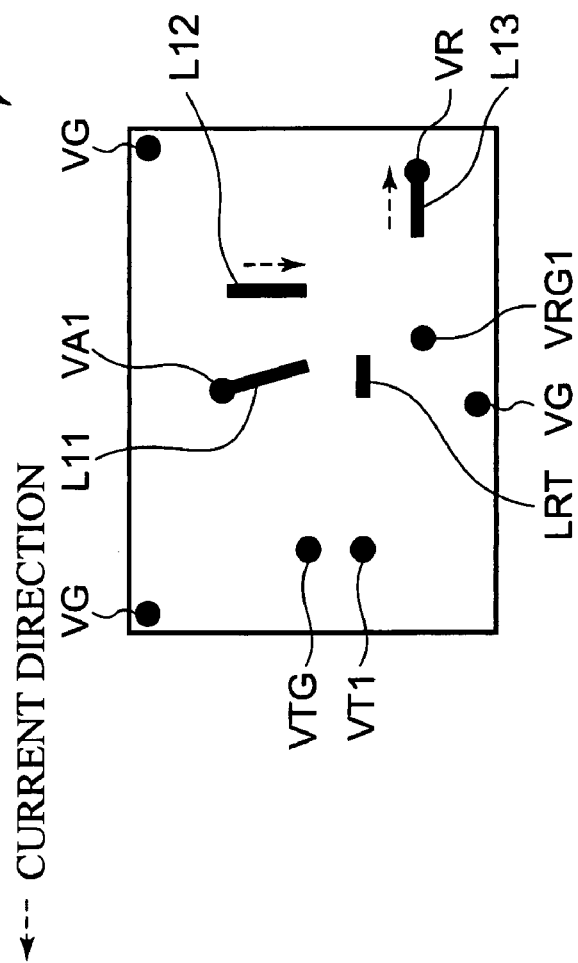
FIGS. 7A and 7B show the die-attach layers of Comparative Example 1 and the first embodiment, respectively.
Figure 7B:
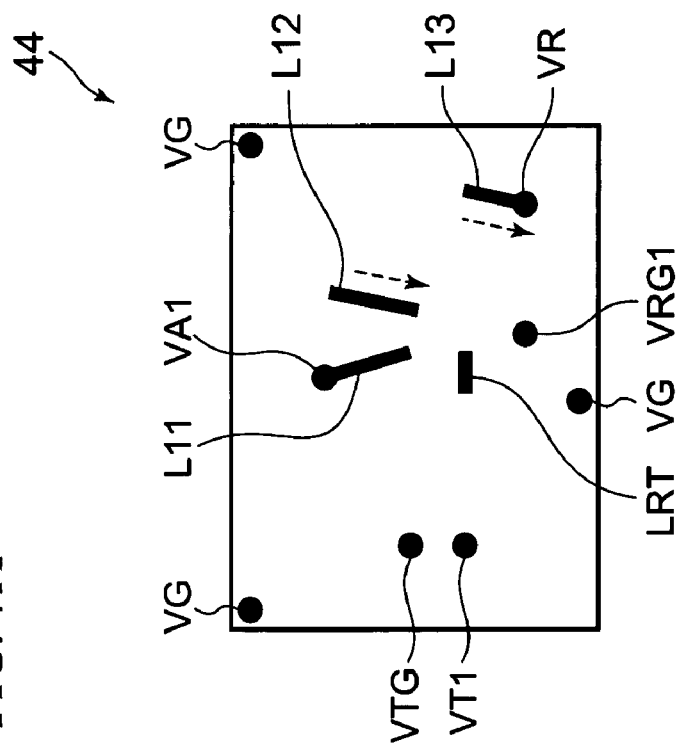

A duplexer in accordance with a Comparative Example 1 was produced, and the characteristics of the duplexer in accordance with Comparative Example 1 were compared with the characteristics of the duplexer in accordance with the first embodiment. FIGS. 7A and 7B illustrate the die-attach layer 44 of Comparative Example 1 and the die-attach layer 44 of the first embodiment, respectively. FIG. 7B shows the current flow in the structure of FIG. 5C, minus the chips 11, 21, and 31. As shown in FIG. 7A, on the die-attach layer 44 of Comparative Example 1, the first inductor line L12 and the first terminal line L13 are arranged to run parallel to each other, and the currents flowing through the first inductor line L12 and the first terminal line L13 flow in the same direction. As shown in FIG. 7B, on the die-attach layer 44 of the first embodiment, the first inductor line L12 and the first terminal line L13 are arranged substantially at 90 degrees with respect to each other, and the directions of the currents flowing through the first inductor line L12 and the first terminal line L13 are substantially at 90 degrees with respect to each other.

Figure 8:
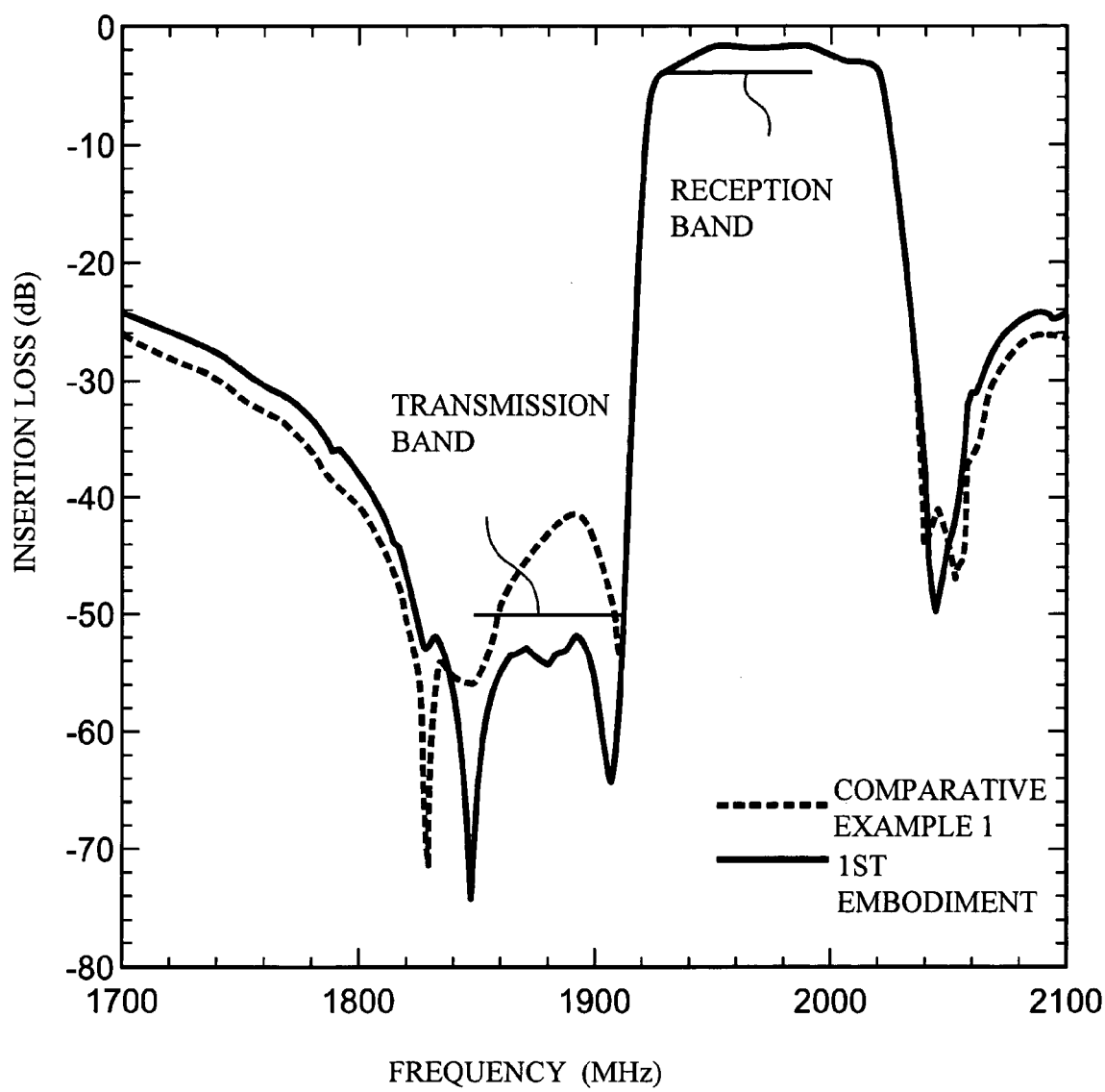
FIG. 8 shows the bandpass characteristics of the duplexers of Comparative Example 1 and the first embodiment.

FIG. 8 shows the bandpass characteristics of the first filters 10 (the reception filters) of Comparative Example 1 and the first embodiment. In the reception band, Comparative Example 1 and the first embodiment exhibit the same characteristics, and there is no difference between the two in the pass band. In the transmission band, the first embodiment has a larger attenuation than Comparative Example 1. Accordingly, the first embodiment exhibits a higher degree of suppression in the stop band (the transmission band). In the first embodiment, the directions of the currents flowing through the first inductor line L12 and the first terminal line L13 are arranged substantially at right angles with respect to each other, so as to increase the attenuation amount in the stop band. This is because, the mutual inductance between the first inductor line L12 and the first terminal line L13 can be reduced. In the first embodiment, the directions of the currents flowing through the first inductor line L12 and the first terminal line L13 are substantially at 90 degrees with respect to each other. However, the directions of those currents should be arranged so as to reduce the mutual inductance between the first inductor line L12 and the first terminal line L13. Such an effect can be achieved by arranging the first inductor line L12 and the first terminal line L13 so that the directions of the currents flowing through the first inductor line L12 and the first terminal line L13 cross each other (cross on the line extending in the current direction).

Figure 9:
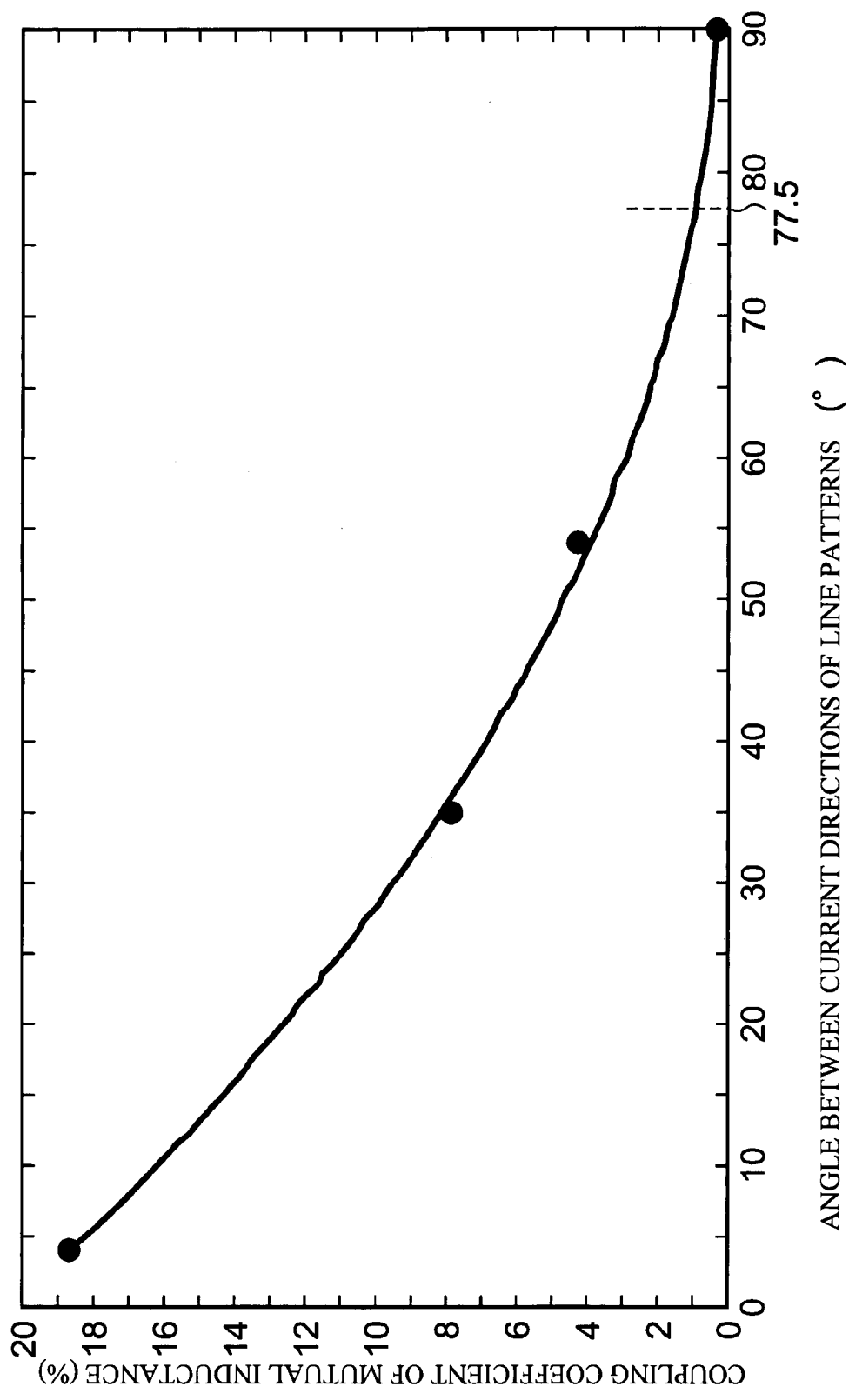
FIG. 9 shows the angles formed by the currents flowing through two line patterns and the coupling coefficients of the mutual inductance between the line patterns.

FIG. 9 shows the results of calculations performed to measure the angles formed by the currents flowing through the two line patterns and the mutual inductance between the two line patterns. When the angle formed by the currents flowing through the two line patterns is 90 degrees, the mutual inductance can be minimized. So as to reduce the mutual inductance to 1% or smaller, the directions of the currents flowing through the line patterns should be at angles of 77.5 degrees to 102.5 degrees. Further, to reduce the mutual inductance to 0.5% or smaller, the directions of the currents flowing through the line patterns should be at angles of 85 degrees to 95 degrees. To sum up, the angles formed by the currents flowing through the first inductor line L12 and the first terminal line L13 is preferably 77.5 degrees to 102.5 degrees, and more preferably 85 degrees to 95 degrees.

Second Embodiment

Figure 10A:
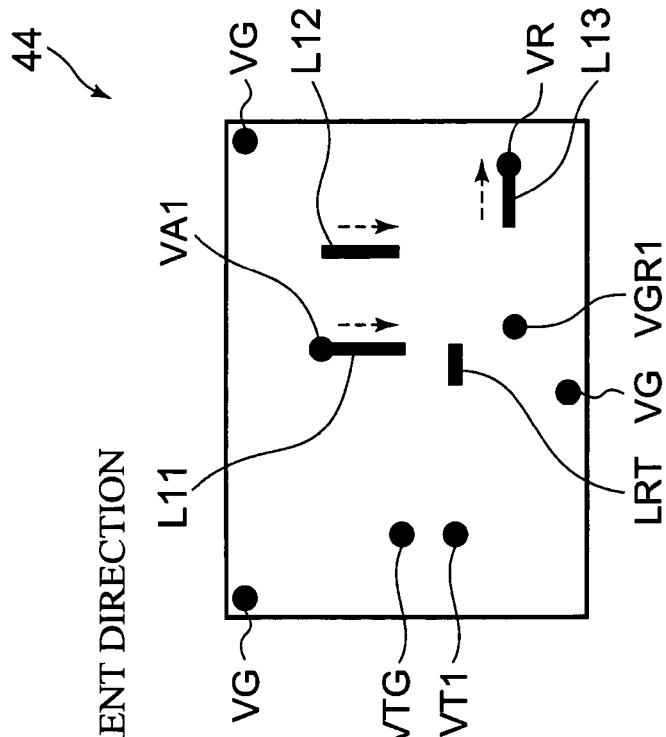
FIGS. 10A and 10B show the die-attach layers of Comparative Example 1 and a second embodiment of the present invention, respectively.
Figure 10B:
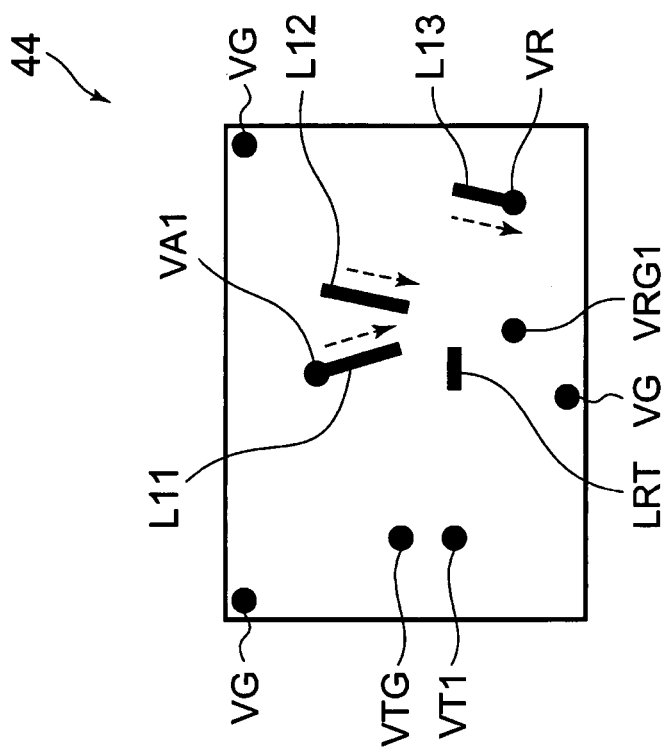

A second embodiment is an example where the directions of the currents flowing through the common line L11 and the first terminal line L13 are also at 90 degrees with respect to each other, as well as the directions of the currents flowing through the first inductor line L12 and the first terminal line L13. FIG. 10A is a plan view showing the surface of the die-attach layer 44 of Comparative Example 1, and is the same drawings a FIG. 7A. FIG. 10B is a plan view of the surface of the die-attach layer 44 of a duplexer in accordance with the second embodiment. The other stacked layers are the same as those of the first embodiment, and explanation of them is omitted here. The die-attach layer 44 of this embodiment differs from the die-attach layer 44 of the first embodiment shown in FIG. 7B in that the directions of the currents flowing through the common line L11 and the first terminal line L13 are substantially at 90 degrees with respect to each other, as well as the directions of the currents flowing through the first inductor line L12 and the first terminal line L13. The other aspects of the structure are the same as those of the first embodiment, and explanation of them is omitted here.

Figure 11:
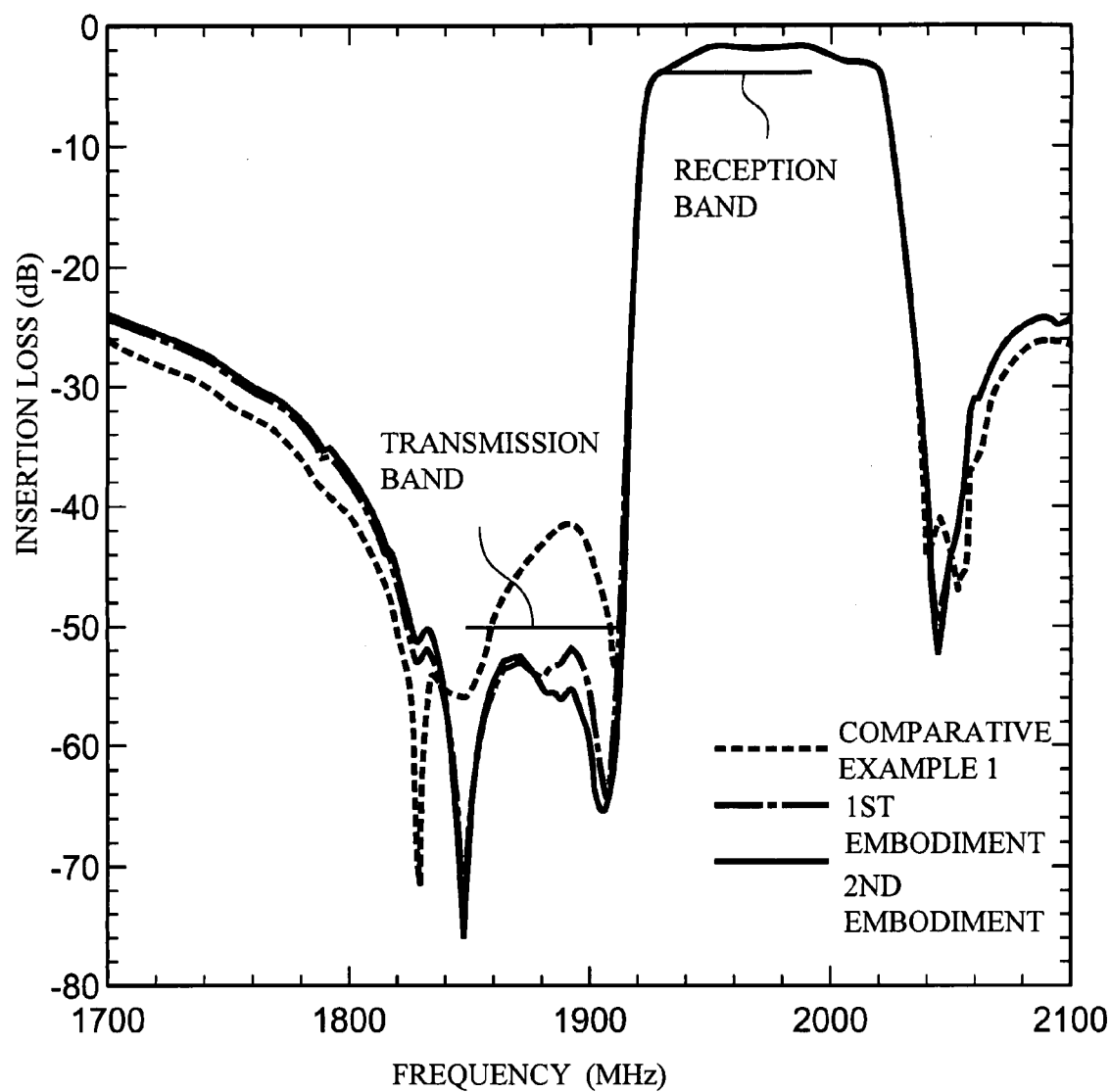
FIG. 11 shows the bandpass characteristics of the duplexers of Comparative Example 1 and the first and the second embodiments.

FIG. 11 shows the bandpass characteristics of the first filters 10 of the duplexers of Comparative Example 1 and the first and second embodiments. In the reception band, Comparative Example 1 and the second embodiment are almost the same, and there is no difference in insertion loss between the two in the pass band. In the transmission band, however, the second embodiment exhibits a larger attenuation amount than the first embodiment. Accordingly, the second embodiment can provide an even higher degree of suppression in the transmission band.

Since the directions of the currents flowing through the common line L11 (the first common line) and the first terminal line L13 are arranged to cross each other, the mutual inductance can be reduced. Further, the angles formed by the currents flowing through the common line L11 and the first terminal line L13 is preferably 77.5 degrees to 102.5 degrees, and more preferably 85 degrees to 95 degrees.

Third Embodiment

Figure 12:
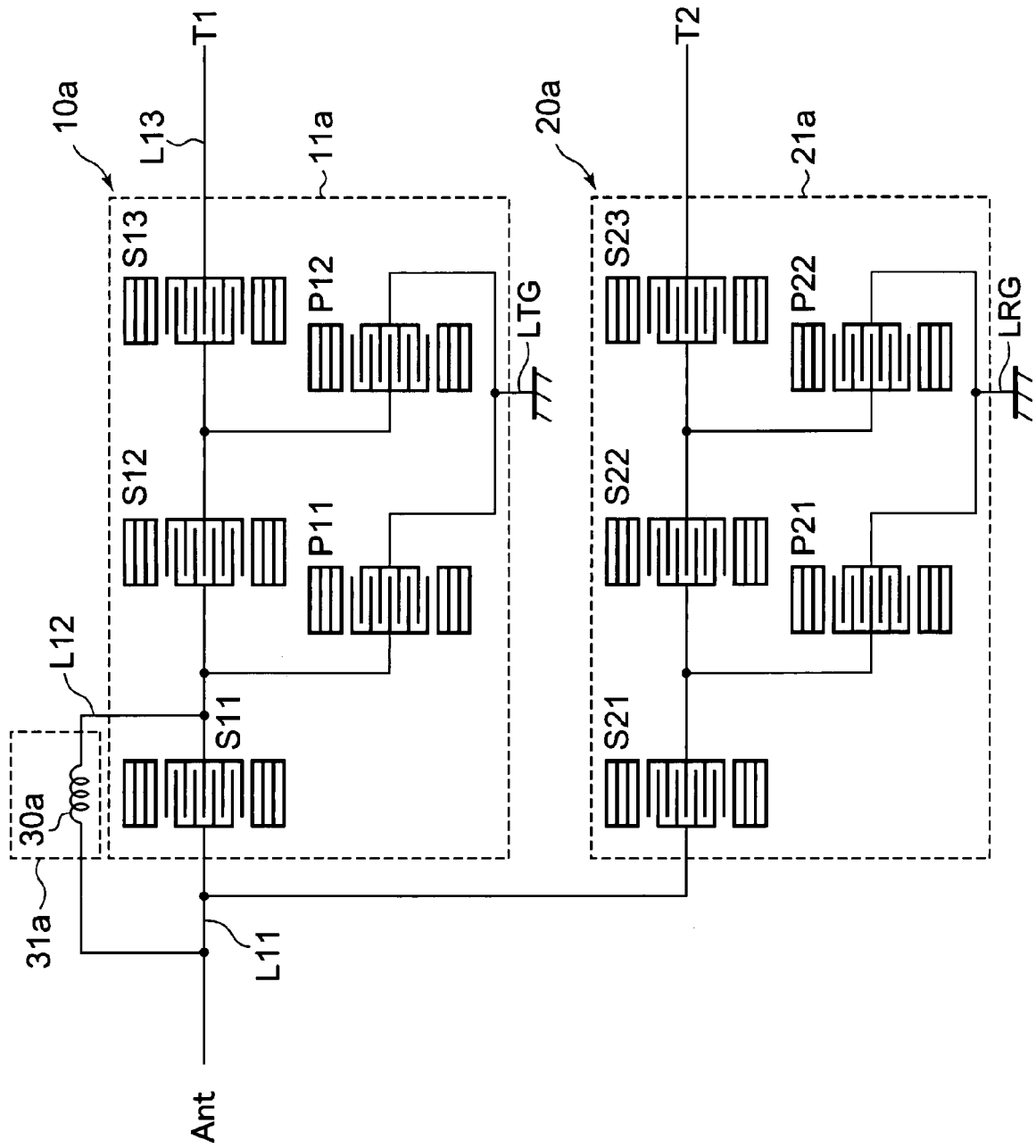
FIG. 12 is a circuit diagram of a duplexer in accordance with a third embodiment of the present invention.

As shown in FIG. 12, a third embodiment of the present invention is an example case where a first filter 10a having a first inductor 30a connected in parallel to a series-arm resonator is used as a transmission filter, and a second filter 20a is used as a reception filter. A first terminal T1 serves as a transmission terminal, and a second terminal T2 serves as a reception terminal. The series-arm resonators S11 through S13 and the parallel-arm resonators P11 and P12 of the first filter 10a (the transmission filter) are formed in a first filter chip 11a. The series-arm resonators S21 through S23 and the parallel-arm resonators P21 and P22 of the second filter 20a (the reception filter) are formed in a second filter chip 21a. The first inductor 30a is formed in an inductor chip 31a. A common line L11 connects a common terminal Ant and the first filter 10a. A first inductor line L12 connects the first inductor 30a and the series-arm resonator S11. A first terminal line T13 connects the first filter 10a and the transmission terminal T1.

Figure 13A:
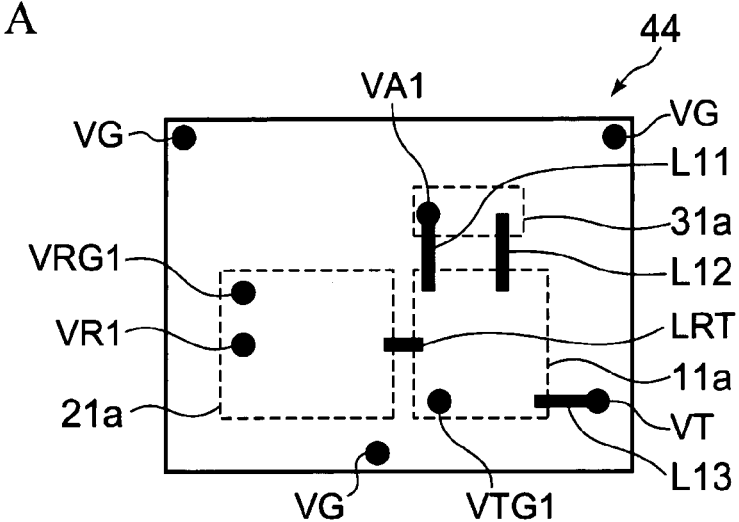
FIGS. 13A through 13C show the respective layers of the stacked package in accordance with the third embodiment.
Figure 13B:
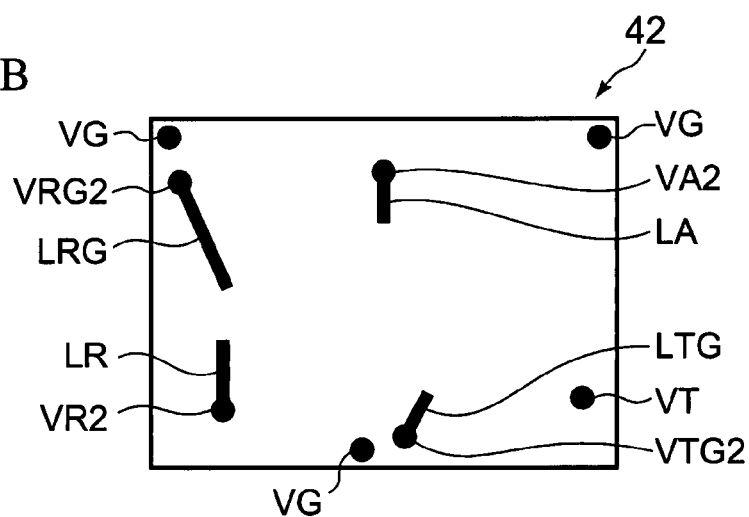
Figure 13C:
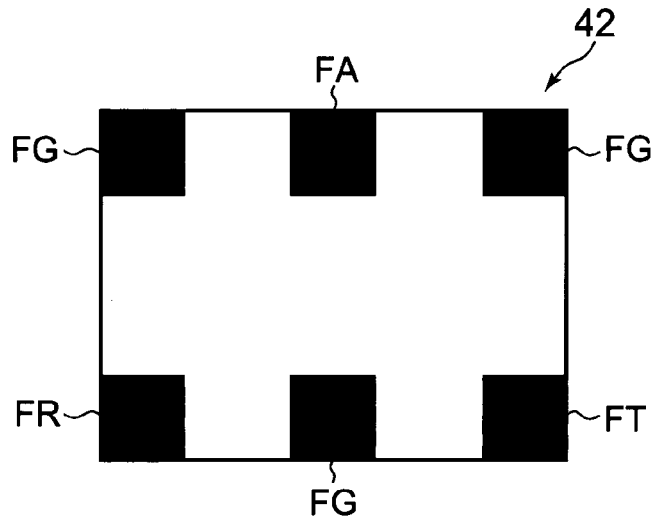

FIGS. 13A through 13C show the top face of the die-attach layer 44, the top face of the line pattern/foot pad layer 42, and a perspectively-seen bottom face of the line pattern/foot pad layer 42 of the third embodiment, respectively. The other stacked layers of the third embodiment are the same as those of the first embodiment, and explanation of them is omitted here. Since the first filter 10a serves as the transmission filter and the second filter 20a serves as the reception filter, the vias VR, VRG1, VT1, and VTG1 shown in FIG. 5C are replaced with vias VT, VTG1, VR1, and VRG1, respectively, on the die-attach layer 44 shown in FIG. 13A. On the top face of the line pattern/foot pad layer 42 shown in FIG. 13B, the vias VR, VRG2, VT2, and VTG2, and the line patterns LRG, LT, and LTG shown in FIG. 5D are replaced with vias VT, VTG2, VR2, VRG2, and line patterns LTG, LR, and LRG, respectively. On the bottom face of the line pattern/foot pad layer 42 shown in FIG. 13C, the foot pads FT and FR shown in FIG. 5E are switched. The other aspects of the structure are the same as those of the second embodiment.

Figure 14A:
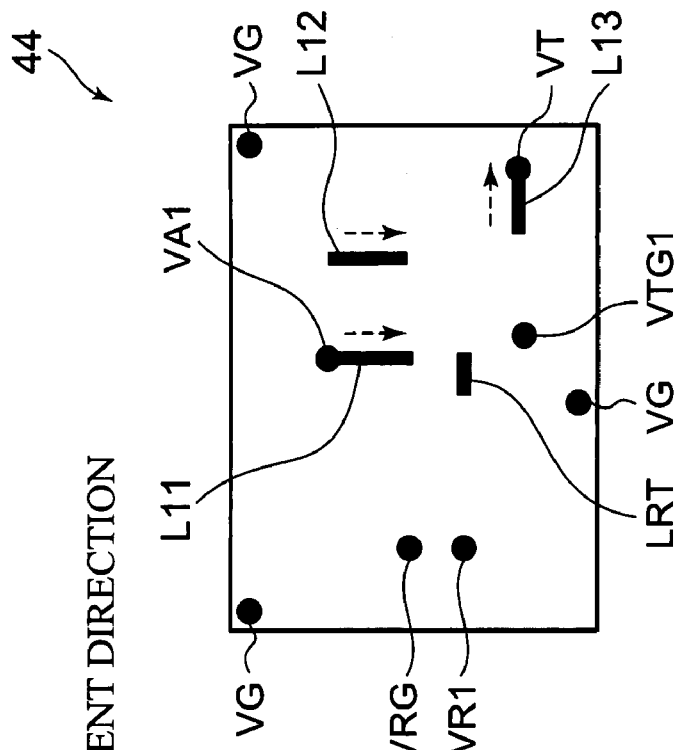
FIGS. 14A and 14B show the die-attach layers of Comparative Example 2 and the third embodiment, respectively.
Figure 14B:
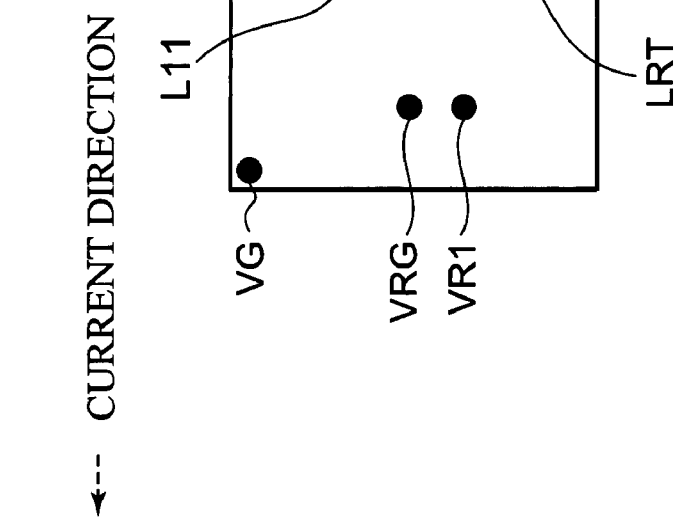

FIGS. 14A and 14B are plan views showing the die-attach layers 44 of Comparative Example 2 and the third embodiment for comparison purposes. As shown in FIG. 14A, the directions of the currents flowing through the first inductor line L12 and the first terminal line L13 of Comparative Example 2 extend substantially parallel to each other. As shown in FIG. 14B, in the third embodiment, the directions of the currents flowing through the first inductor line L12 and the first terminal line L13 are substantially at 90 degrees with respect to each other, and the directions of the currents flowing through the common line L11 and the first terminal line L13 are substantially at 90 degrees with respect to each other. As in the third embodiment, the first filter 10a can serve as the transmission filter, and the second filter 20a can serve as the reception filter. Accordingly, the attenuation amount of the transmission filter in the reception band can be made larger.

Fourth Embodiment

Figure 15:
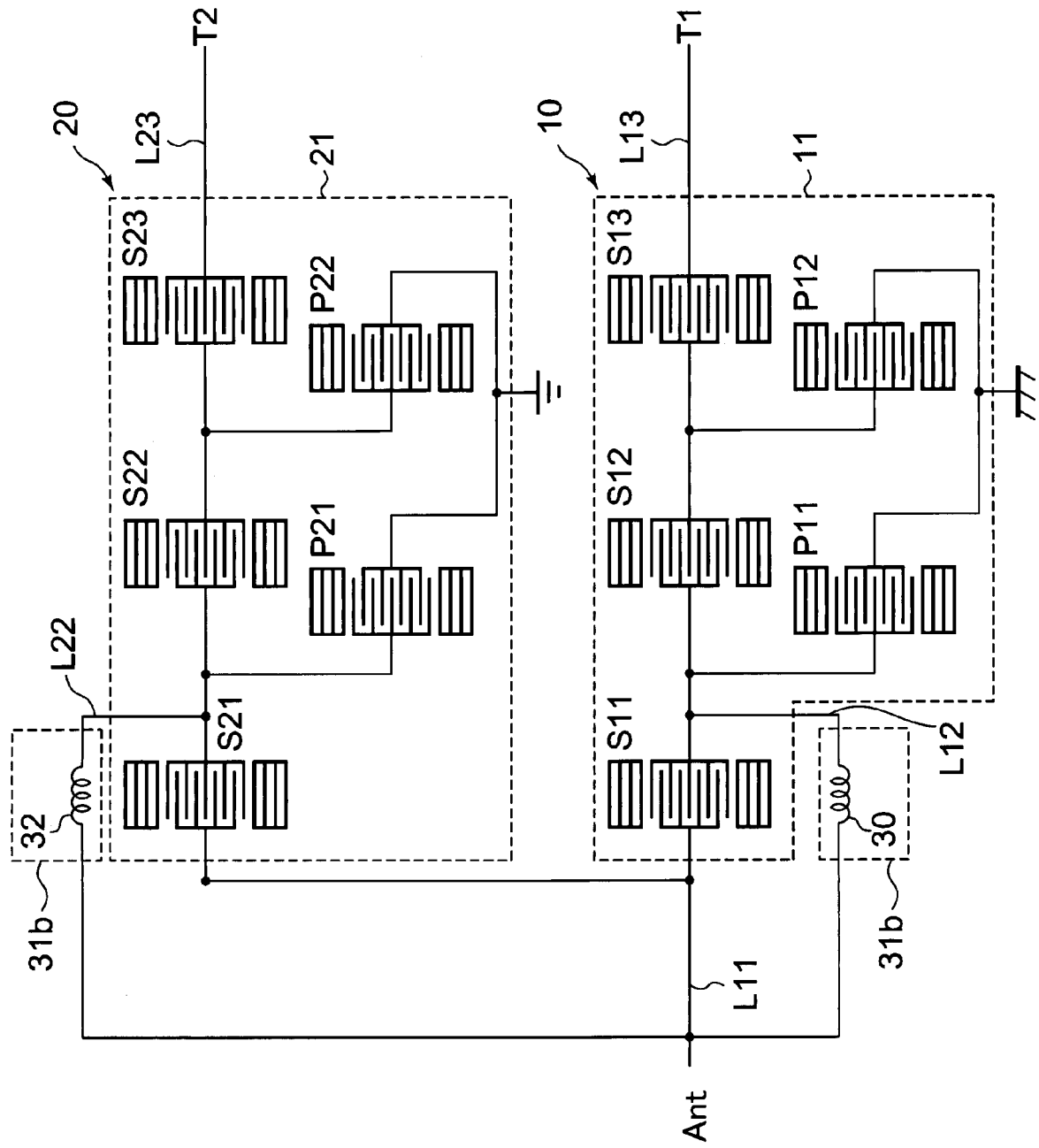
FIG. 15 is a circuit diagram of a duplexer in accordance with a fourth embodiment of the present invention.

A fourth embodiment of the present invention is an example case where the first filter 10 is the reception filter, the second filter 20 is the transmission filter, and the first inductor 30 and a second inductor 32 are connected in parallel to series-arm resonators of the first filter 10 and the second filter 20, respectively. FIG. 15 is a circuit diagram of a duplexer in accordance with the fourth embodiment. The first inductor 30 is connected in parallel to the series-arm resonator S11 (the first series-arm resonator) of the first filter 10 (the reception filter), and the second inductor 32 is connected in parallel to the series-arm resonator S21 (the second series-arm resonator) of the second filter 20 (the transmission filter). The series-arm resonators S11 through S13 and the parallel-arm resonators P11 and P12 of the first filter 10 are formed in the first filter chip 11. The series-arm resonators S21 through S23 and the parallel-arm resonators P21 and P22 of the second filter 20 are formed in the second filter chip 21. The first inductor 30 and the second inductor 32 are formed in an inductor chip 31b. In addition to the lines shown in FIG. 6, the duplexer of this embodiment includes a second inductor line L22 that connects the second inductor 32 and the series-arm resonator S21, and a second terminal line L23 that connects the second filter 20 and the second terminal T2. In this embodiment, the common line L11 also serves as a common line (the second common line) that connects the common terminal Ant and the second filter 20 via the first filter chip 11.

Figure 16B:
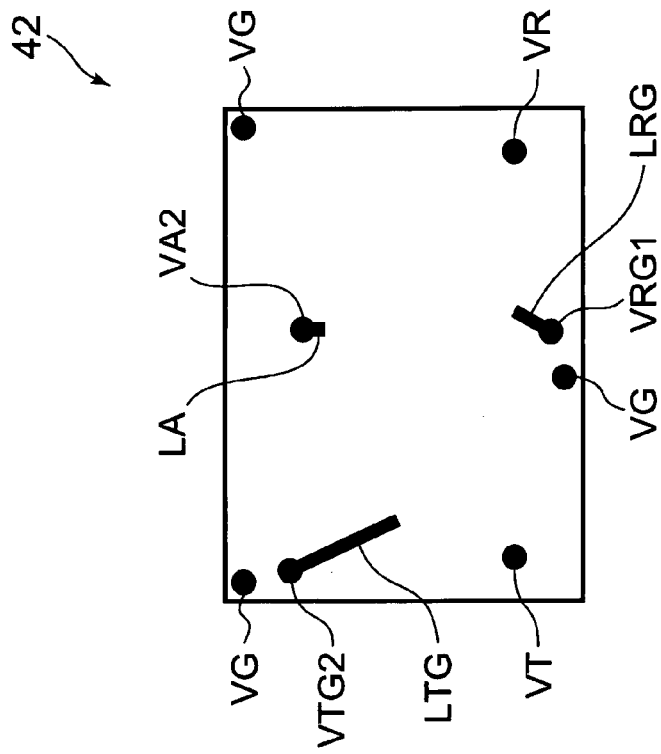
FIGS. 16A and 16B show the respective layers of the stacked package in accordance with the fourth embodiment.
Figure 16A:
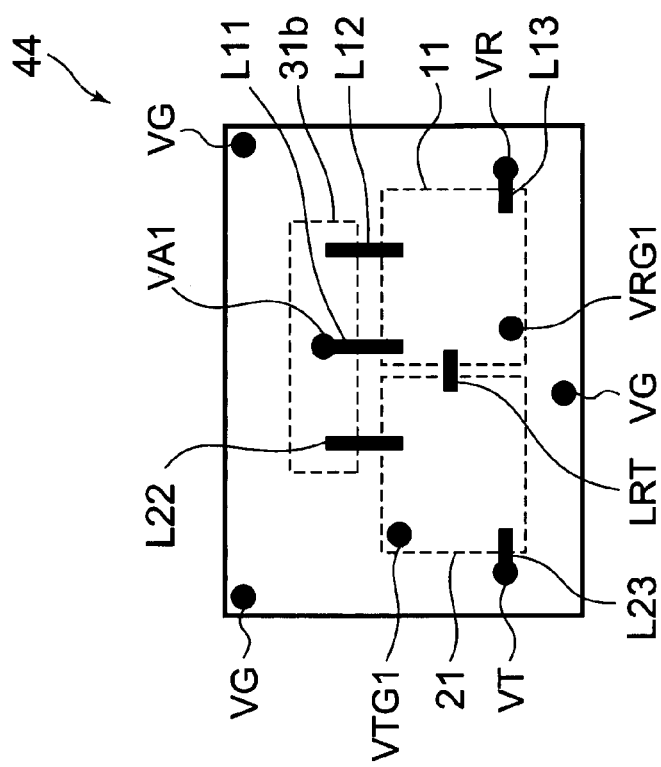

FIGS. 16A and 16B are plan views of the top faces of the die-attach layer 44 and the line pattern/foot pad layer 42 of the fourth embodiment. The other stacked layers of this embodiment are the same as those of the first embodiment, and explanation of them is omitted here. As shown in FIG. 16A, the via VA1 connected to the common terminal Ant is connected to one end of the second inductor 32 of the inductor chip 31b. The other end of the second inductor 32 is connected between the series-arm resonators S21 and S22 of the second filter chip 21 via the second inductor line L22. With this arrangement, the second inductor 32 is connected in parallel to the series-arm resonator S21. The series-arm resonator S23 of the second filter chip 21 and the via VT connected to the second terminal T2 are connected to each other by the second terminal line L23. The other aspects of the structure of this embodiment are the same as those of the first embodiment, and explanation of them is omitted here.

Figure 17A:
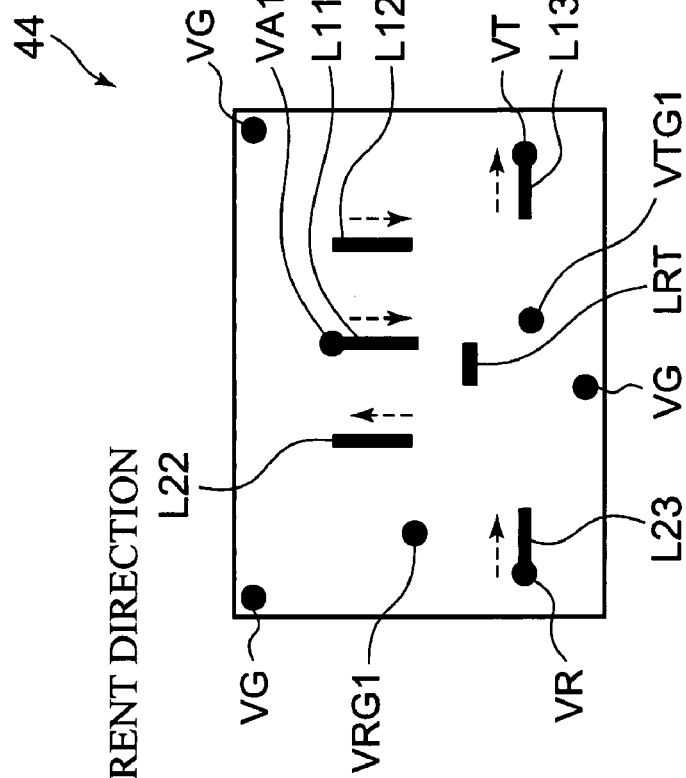
FIGS. 17A and 17B show the die-attach layers of Comparative Example 3 and the fourth embodiment, respectively.
Figure 17B:
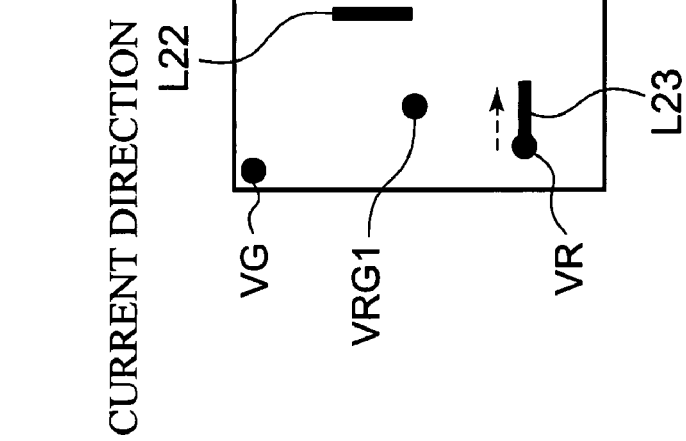

FIGS. 17A and 17B show the surfaces of the die-attach layers 44 of Comparative Example 3 and the fourth embodiment. FIG. 17B is the same as FIG. 16A. As shown in FIG. 17A, in Comparative Example 3, the directions of the currents flowing through the first inductor line L12 and the first terminal line L13 extend substantially parallel to each other. The directions of the currents flowing through the second inductor line L22 and the second terminal line L23 also extend substantially parallel to each other. As shown in FIG. 17B, in the fourth embodiment, the directions of the currents flowing through the first inductor line L12 and the first terminal line L13 are substantially at 90 degrees with respect to each other. Also, the directions of the currents flowing through the second inductor line L22 and the second terminal line L23 are substantially at 90 degrees with respect to each other. Further, the directions of the currents flowing through the common line L11 and the second terminal line L23 are substantially at 90 degrees with respect to each other.

As in the fourth embodiment, the currents flowing through the first inductor line L12 and the first terminal line L13 are designed to cross the currents flowing through the second inductor line L22 and the second terminal line L23 in the first filter 10 and the second filter 20, so that the first filter 10 and the second filter 20 can have a larger attenuation amount in the band of each other. The angles between those currents are preferably in the range of 77.5 degrees to 102.5 degrees, and more preferably, in the range of 85 degrees to 95 degrees.

Further, the currents flowing through the common line L11 (the first common line) and the first terminal line L13 are designed to cross each other, and the currents flowing through the common line L11 (the second common line) and the second terminal line L23 are designed to cross each other in the first filter 10 and the second filter 20. With this arrangement, the first filter 10 and the second filter 20 can have an even larger attenuation amount in the band of each other. The angles between those currents are preferably in the range of 77.5 degrees to 102.5 degrees, and more preferably, in the range of 85 degrees to 95 degrees. In the fourth embodiment, the common line L11 connecting the common terminal Ant and the first filter 10 also serves as the common line L11 connecting the common terminal Ant and the second filter 20. However, two separate common lines may be employed.

In the first through fourth embodiments, which ones of the series-arm resonators S11 through S13 and S21 through S23 the first inductor 30 and the second inductor 32 are to be connected in parallel to may be arbitrarily set. Even in such a case, an attenuation pole can be formed in the band of each other. In the first filter 10, however, the first inductor 30 should preferably be connected to the series-arm resonator S11 closest to the common terminal Ant among the series-arm resonators S11 through S13. With the first inductor 30 being connected to the series-arm resonator S11, the impedance of the first filter 10 seen from the common terminal Ant can be made higher in the pass band of the second filter 20. As a result, a matching circuit becomes unnecessary. Likewise, in the second filter 20, the second inductor 32 should preferably be connected to the series-arm resonator S21 closest to the common terminal Ant among the series-arm resonators S21 through S23.

Fifth Embodiment

Figure 18:
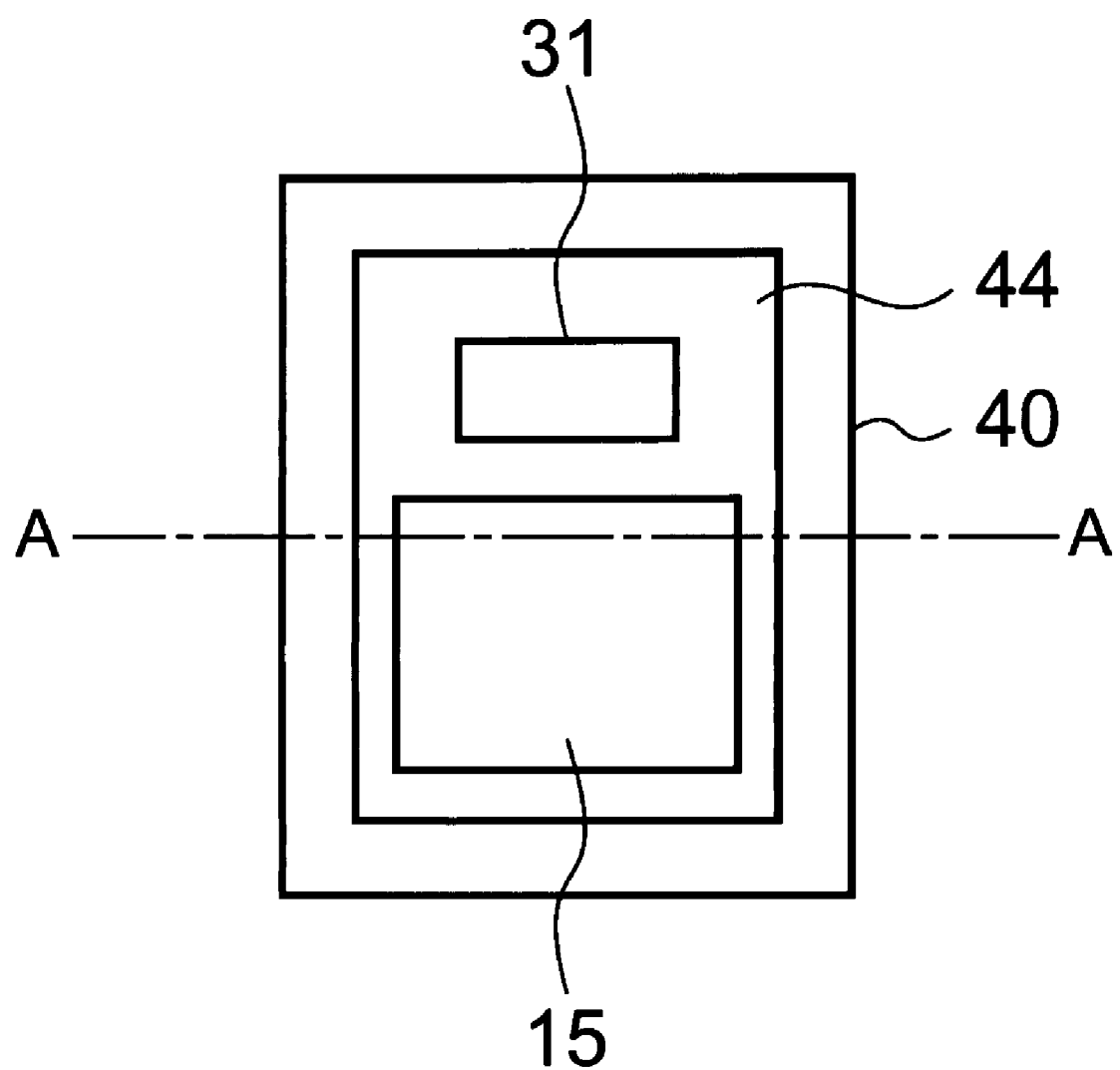
FIG. 18 is a top view of a filter in accordance with a fifth embodiment of the present invention (the cap is not shown)
Figure 19:
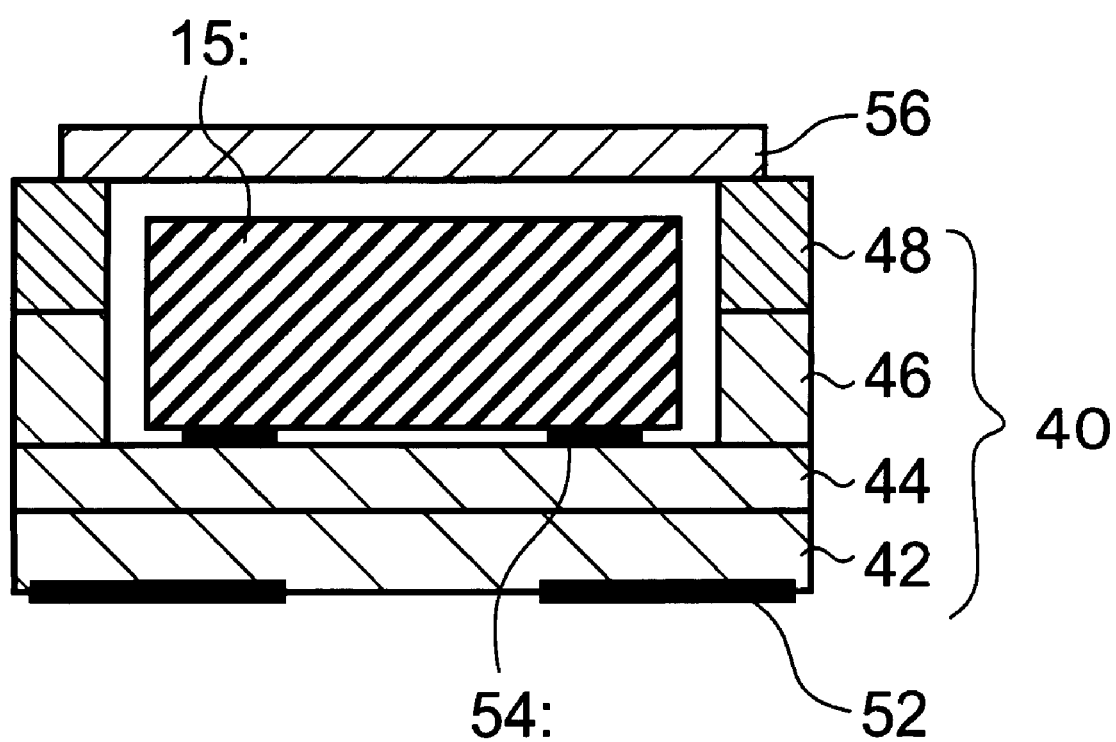
FIG. 19 is a cross-sectional view of the filter, taken along the line A-A of FIG. 18.

A fifth embodiment of the present invention is an example of a filter. FIG. 18 is a top view of the stacked package 40 of the filter in accordance with the fifth embodiment, with the cap 56 being removed. FIG. 19 is a cross-sectional view of the stacked package 40, taken along the line A-A of FIG. 18. As shown in FIG. 18, a filter chip 15 and the inductor chip 31 are face-down mounted on the die-attach layer 44 of the stacked package 40. Series-arm resonators S1 through S3 and parallel-arm resonators P1 and P2 of the filter 14 are formed in the filter chip 15. The first inductor 30 is formed in the inductor chip 31. The other aspects of the structure of this embodiment are the same as those of the structure of the first embodiment shown in FIGS. 2 and 3, and explanation of them is omitted here.

Figure 20:
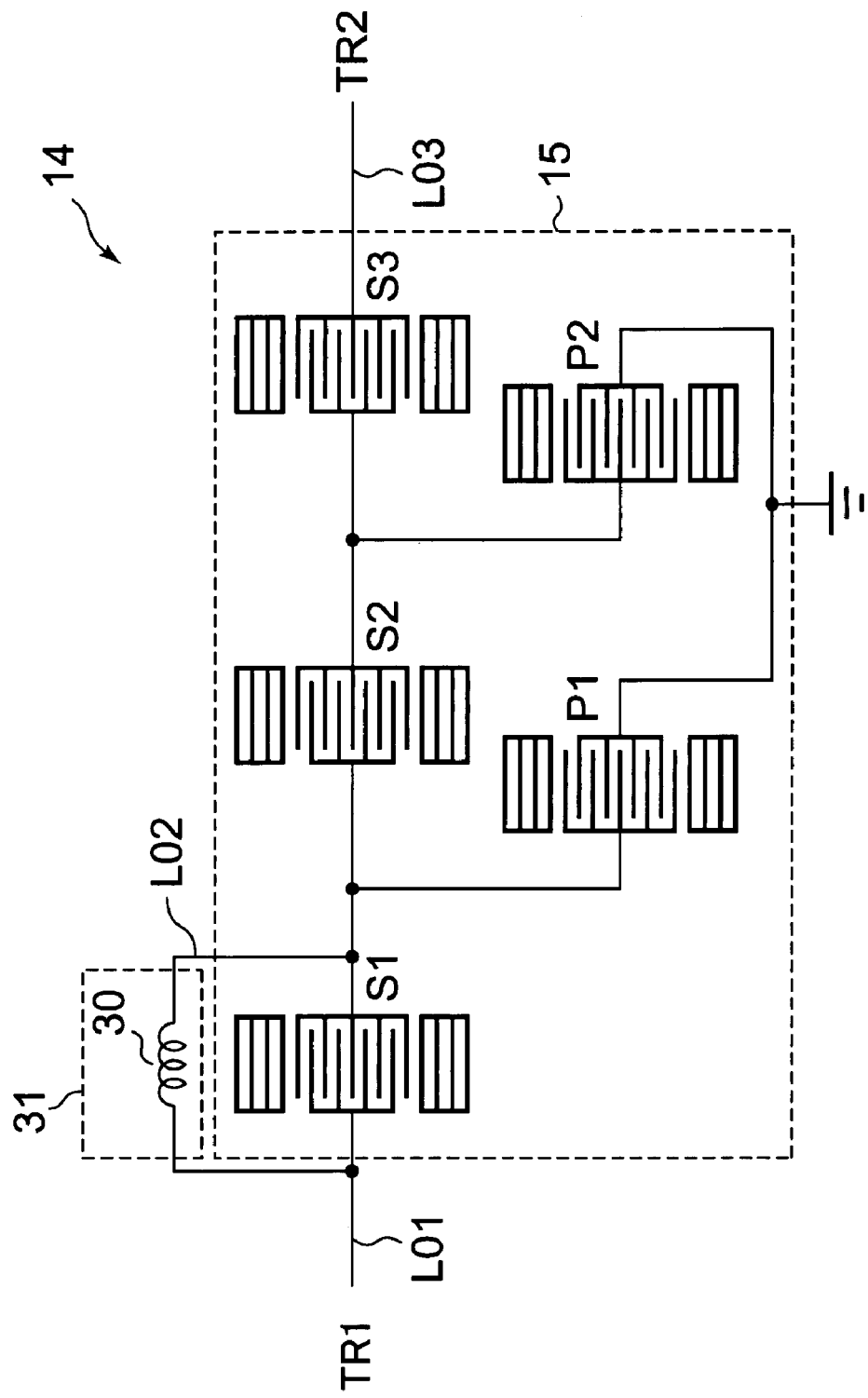
FIG. 20 is a circuit diagram of the filter in accordance with the fifth embodiment.

FIG. 20 is a circuit diagram of the filter 14 in accordance with the fifth embodiment. The series-arm resonators S1 through S3 are connected between a first input/output terminal TR1 and a second input/output terminal TR2, and the parallel-arm resonators P1 and P2 are connected in parallel. Those resonators are formed in the filter chip 15. The inductor 30 is connected in parallel to the series-arm resonator S1, and is formed in the IPD chip 31. A first line L01 connects the first input/output terminal TR1 to one end of the series-arm resonator S1 of the filter 14. An inductor line L02 connects the inductor 30 to the other end of the series-arm resonator S1. A second line L03 connects the second input/output terminal TR2 to the series-arm resonator S3.

Figure 21A:
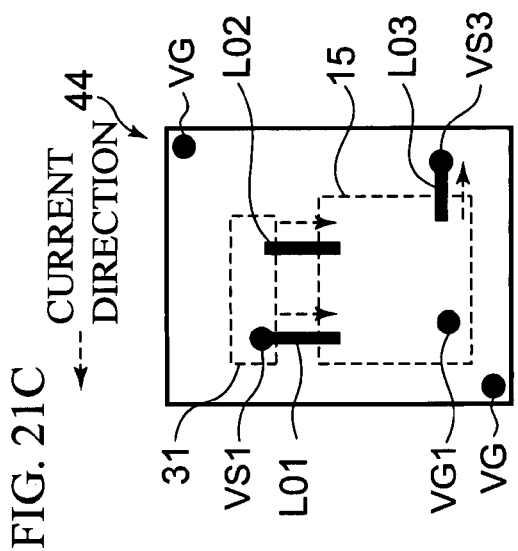
FIGS. 21A through 21E show the respective layers of the stacked package of the fifth embodiment.
Figure 21B:
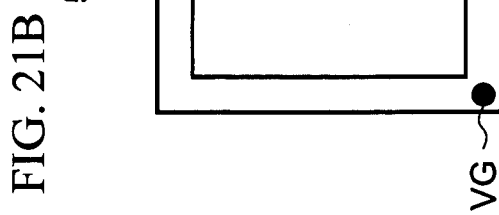
Figure 21C:
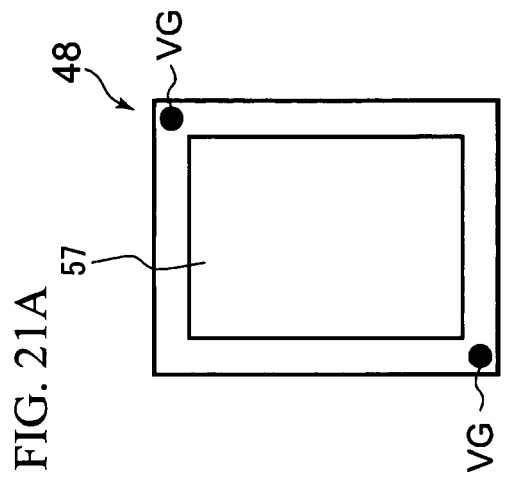
Figure 21E:
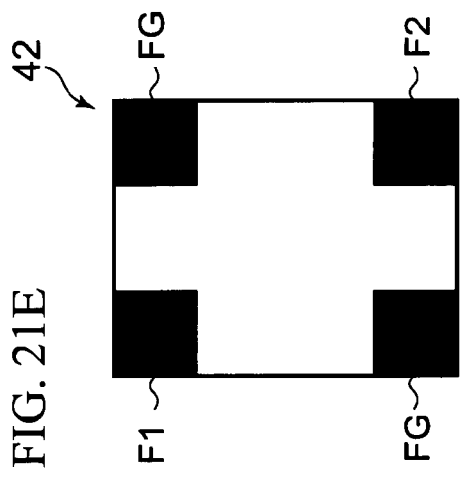
Figure 21D:
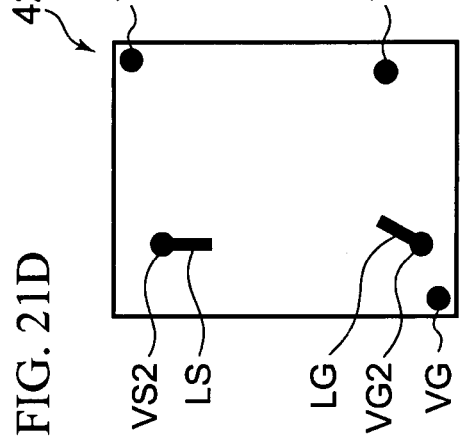

Referring now to FIGS. 21A through 21E, the structure of each stacked layer in the stacked package 40 is described. FIGS. 21A and 21B show the cap mounting layer 48 and the cavity layer 46, respectively. The cap mounting layer 48 and the cavity layer 46 are the same as those of the first embodiment, and explanation of them is omitted here. FIGS. 21C through 21E show the top faces of the die-attach layer 44 and the line pattern/foot pad layer 42, and the bottom face of the line pattern/foot pad layer 42 seen from the above. A foot pad F1 that is the first input/output terminal TR1 is connected to one end of the inductor 30 formed in the inductor chip 31 via a via VS2 and a line pattern LS formed on the line pattern/foot pad layer 42, and a via VS1 formed on the die-attach layer 44. The first input/output terminal TR1 is connected to one end of the series-arm resonator S1 of the filter chip 15 via the first line L01. The other end of the inductor 30 is connected to the other end of the series-arm resonator S1 of the filter chip 15 via the inductor line L02. With this arrangement, the inductor 30 is connected in parallel to the series-arm resonator S1. The series-arm resonator S3 of the filter chip 15 is connected to the foot pad F2 that is the second input/output terminal TR2 via the second line L03 and a via VS3. The parallel-arm resonators P1 and P2 of the filter chip 15 are short-circuited on the ground side on the filter chip 15, and are connected to foot pads FG that are ground terminals via a via VG1, a line pattern LG, and a via VG2.

As in the fifth embodiment, the directions of the currents flowing through the inductor line L02 and the second line L03 cross each other in the filter 14. With this arrangement, the attenuation amount in the stop band can be made larger. So as to reduce the mutual inductance, the angles between the directions of those currents are preferably in the range of 77.5 degrees to 102.5 degrees, and more preferably, in the range of 85 degrees to 95 degrees. Also, the directions of the currents flowing through the first line L01 and the second line L03 cross each other. With this arrangement, the attenuation amount in the stop band can be made even larger. To further reduce the mutual inductance, the angles between the directions of those currents are preferably in the range of 77.5 degrees to 102.5 degrees, and more preferably, in the range of 85 degrees to 95 degrees.

Sixth Embodiment

Figure 22:
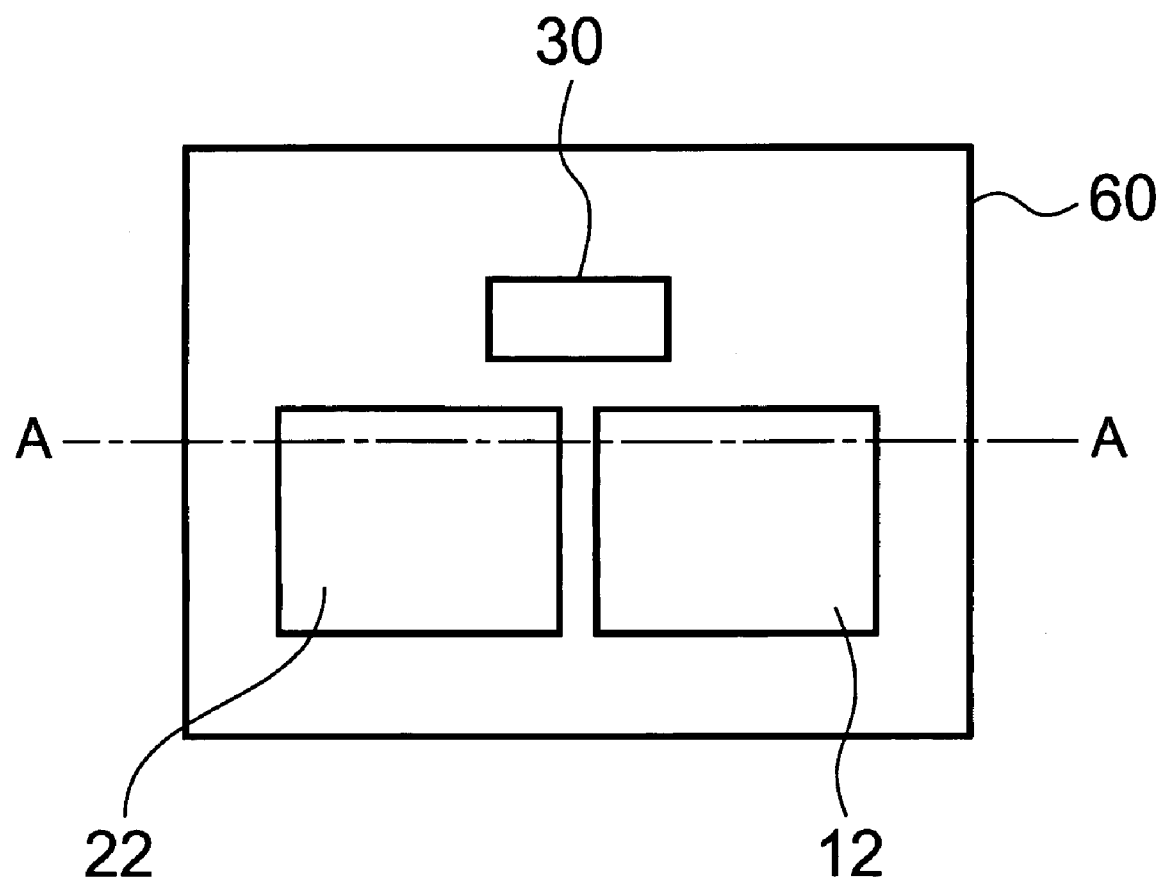
FIG. 22 is a top view of a duplexer in accordance with a sixth embodiment of the present invention.
Figure 23:
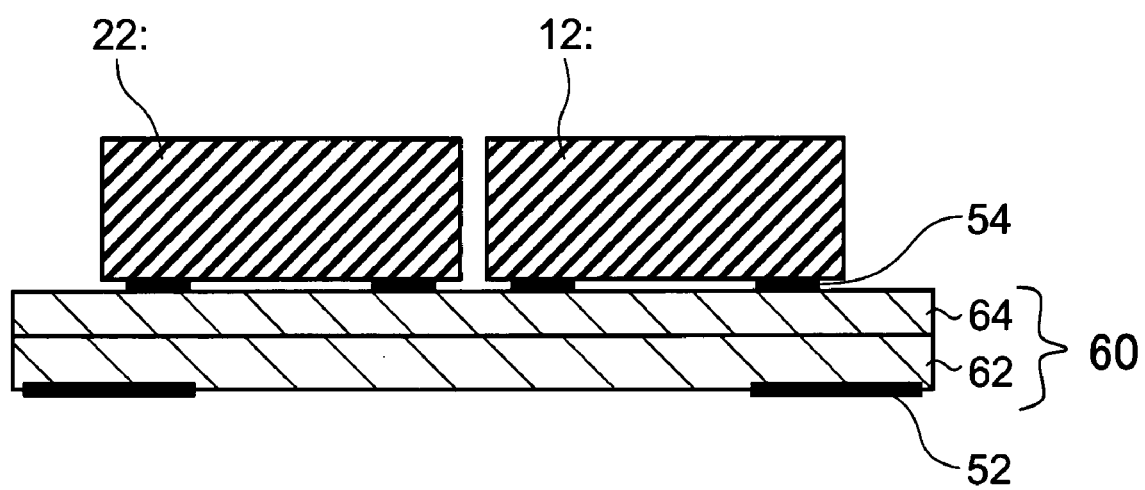
FIG. 23 is a cross-sectional view of the duplexer, taken along the line A-A of FIG. 22.

A sixth embodiment of the present invention is an example case where a stacked substrate 60 is used as the mounting unit. FIG. 22 is a top view illustrating the sixth embodiment. The inductor chip 31, a first filter package 12 having the first filter 10 hermetically sealed therein, and a second filter package 22 having the second filter 20 hermetically sealed therein are mounted onto the stacked substrate 60. FIG. 23 is a cross-sectional view of the structure of this embodiment, taken along the like A-A of FIG. 22. The stacked substrate 60 is an organic substrate, and is formed with a die-attach layer 64 and a line pattern/foot pad layer 62. The first filter package 12 and the second filter package 22 are mounted onto the die-attach layer 64 with bumps 54. The structures of the die-attach layer 64 and the line pattern/foot pad layer 62 of this embodiment are the same as those of the first embodiment, and explanation of them is omitted here.

The mounting unit should have the function of mounting the filter chips. As in the first through sixth embodiments, the mounting unit may be the stacked package 40 or the stacked substrate 60. Each filter may be mounted directly onto the mounting unit as in the first through fifth embodiment, or may be mounted onto the mounting unit while sealed in a package as in the sixth embodiment. The stacked package 40 or the stacked substrate 60 may be made of alumina ceramics or glass ceramics as in the first through fifth embodiment, or may be formed with an organic substrate as in the sixth embodiment.

Seventh Embodiment

Figure 24:
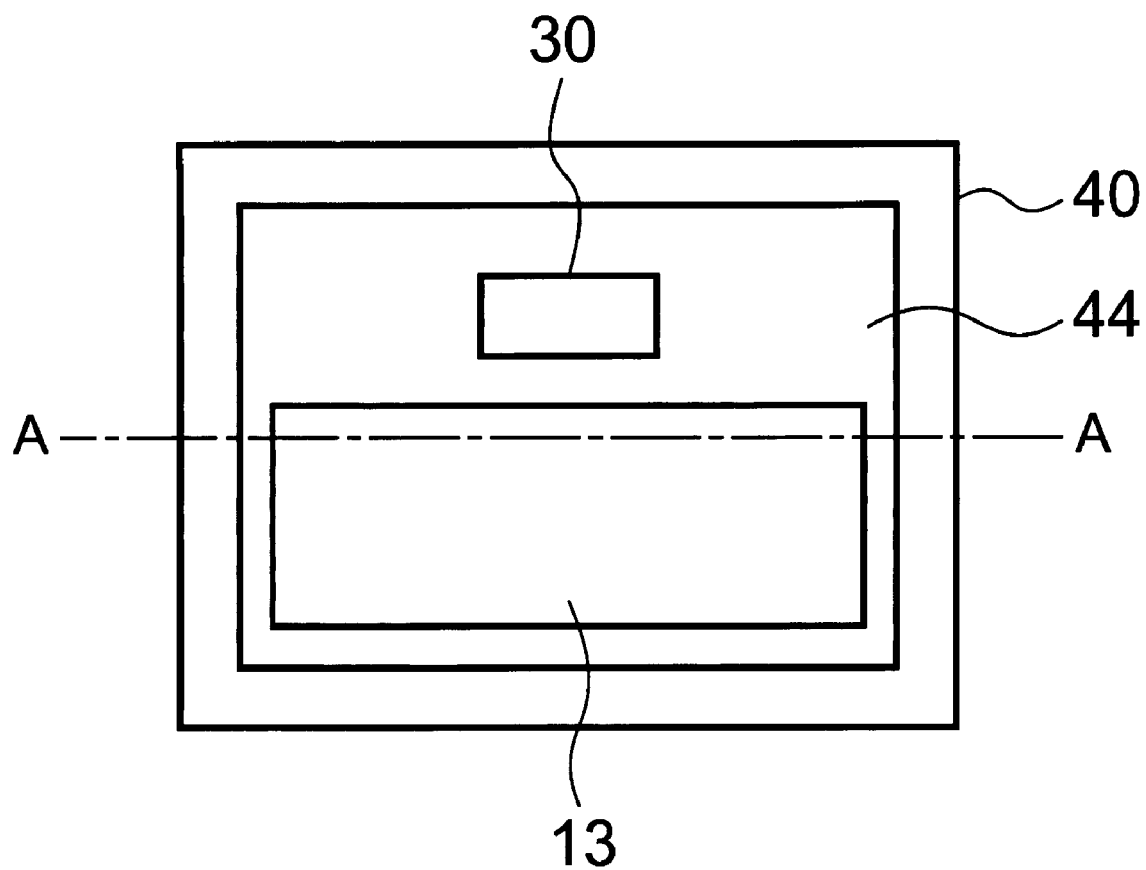
FIG. 24 is a top view of a duplexer in accordance with a seventh embodiment of the present invention (the cap is not shown)
Figure 25:
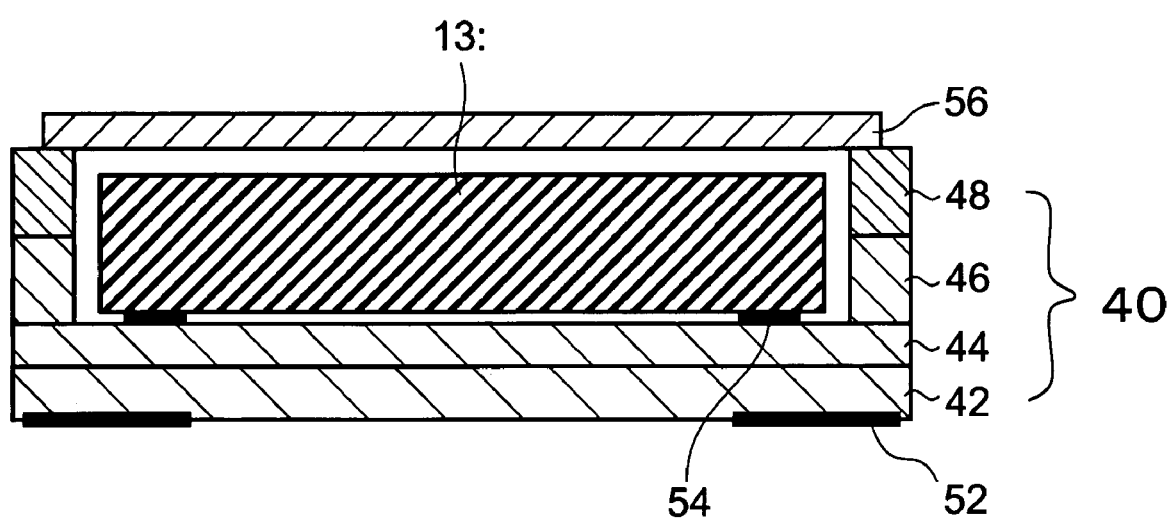
FIG. 25 is a cross-sectional view of the duplexer, taken along the line A-A of FIG. 24.
Figure 26:
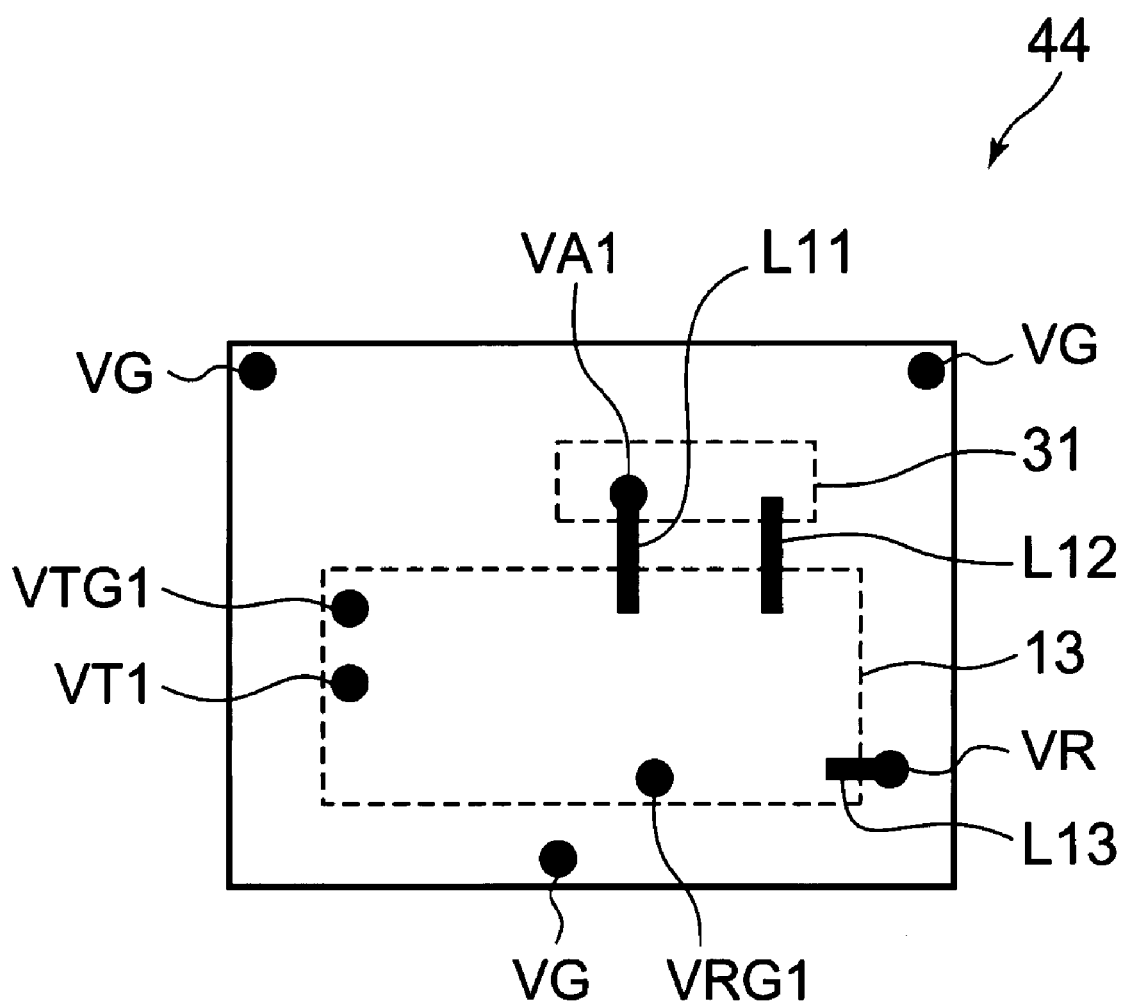
FIG. 26 shows the die-attach layer of the seventh embodiment.

A seventh embodiment is an example case where the first filter 10 and the second filter 20 are formed in one filter chip 13. FIG. 24 is a top view of the structure in accordance with the seventh embodiment. The first filter chip 11 and the second filter chip 21 shown in FIG. 2 are replaced with the single filter chip 13. FIG. 25 is a cross-sectional view of the structure of this embodiment, taken along the line A-A of FIG. 24. The first filter chip 11 and the second filter chip 21 shown in FIG. 3 are replaced with the single filter chip 13. FIG. 26 shows the die-attach layer 44. Since the first filter chip 11 and the second filter chip 21 of the second embodiment shown in FIG. 10B are replaced with the filter chip 13, and the line pattern LRT connecting the first filter chip 11 and the second filter chip 21 is formed in the filter chip 13, the line pattern is not formed on the die-attach layer 44. The other aspects of the structure of this embodiment are the same as those of the second embodiment, and explanation of them is omitted here. As in the seventh embodiment, the first filter 10 and the second filter 20 can be formed in the single filter chip 13.

Eighth Embodiment

Figure 27:
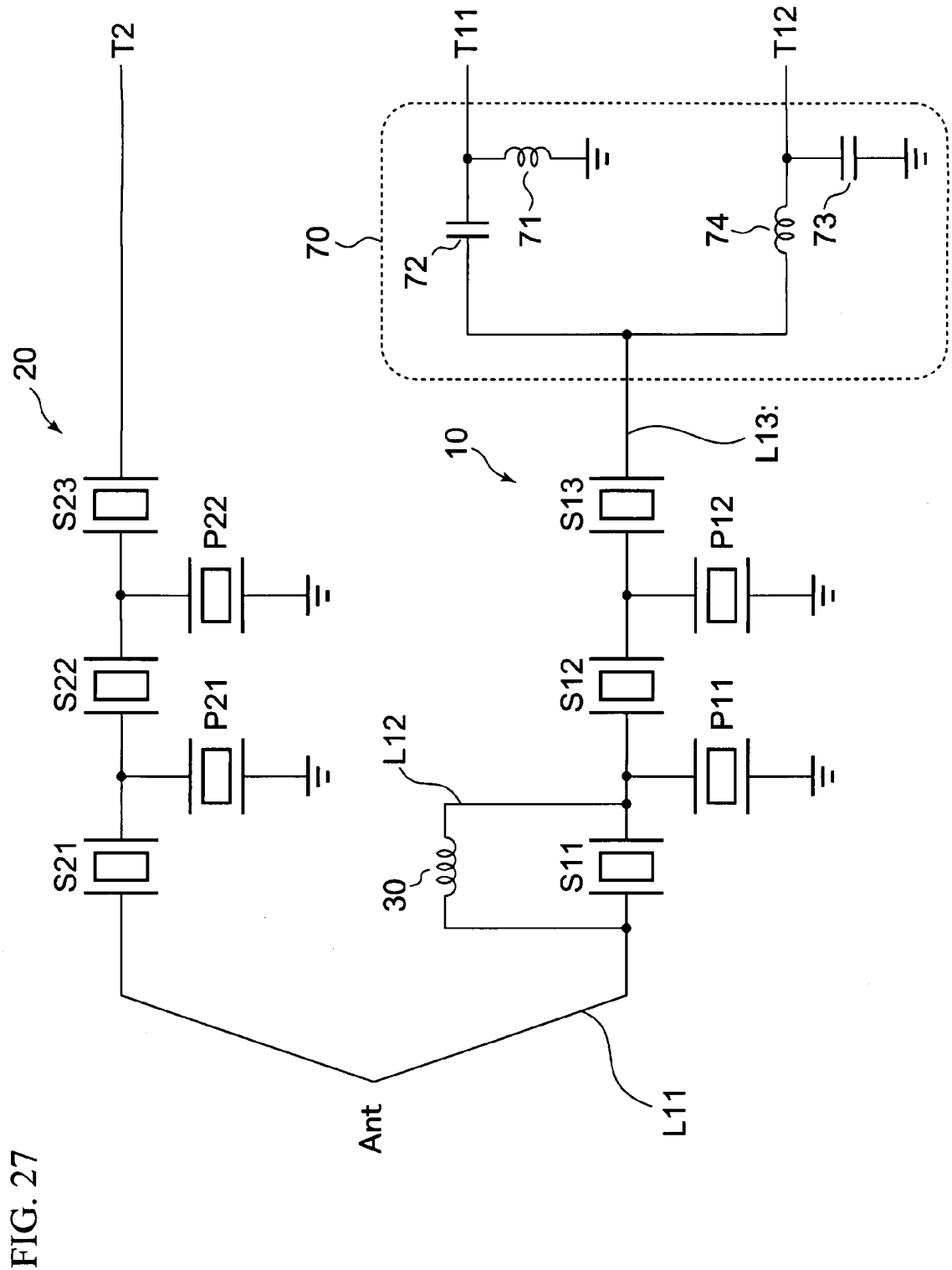
FIG. 27 is a circuit diagram of a duplexer in accordance with an eighth embodiment of the present invention.

An eighth embodiment of the present invention is an example of a balanced-output duplexer having a lumped parameter balun connected to the first terminal line L13 of the duplexer of the first embodiment. As shown in FIG. 27, the series-arm resonator S13 of the first filter 10 (the reception filter) is connected to the lumped parameter balun 70 via the first terminal line L13. In the lumped parameter balun 70, a capacitor 72 is connected in series between the first terminal line L13 and a first terminal 1 T11, and an inductor 71 is connected in parallel between the first terminal line L13 and the first terminal 1 T11. In the lumped parameter balun 70, an inductor 74 is also connected in series between the first terminal line L13 and a first terminal 2 T12, and a capacitor 73 is also connected in parallel between the first terminal line L13 and the first terminal 2 T12. The other aspects of the structure of this embodiment are the same as those of the first embodiment, and explanation of them is omitted here. In this structure, the balun 70 has the first terminal 1 T11 and the first terminal 2 T12. The balun 70 causes the first terminal 1 T11 and the first terminal 2 T12 to input or output a signal input or output through the first terminal line L13 as signals having different phases from each other (generally having phases that differ from each other by 180 degrees). In this manner, with the balun 70, unbalanced-to-balanced conversion can be performed. With the balun 70 being built in a filter or a duplexer, it is not necessary to employ separate baluns.

Although the balun 70 is connected to the reception filter in the eighth embodiment, the balun 70 may be connected to the transmission filter. In such a case, the balun 70 inputs signals with different phases from each other. Alternatively, one balun 70 may be connected to each of the reception filter and the transmission filter. In some portable telephone terminals, signals on the reception side are of a differential type, so as to restrain the common-mode noise in the high-frequency circuits. In such cases, the balun 70 is effectively connected to the reception filter.

Ninth Embodiment

Figure 28:
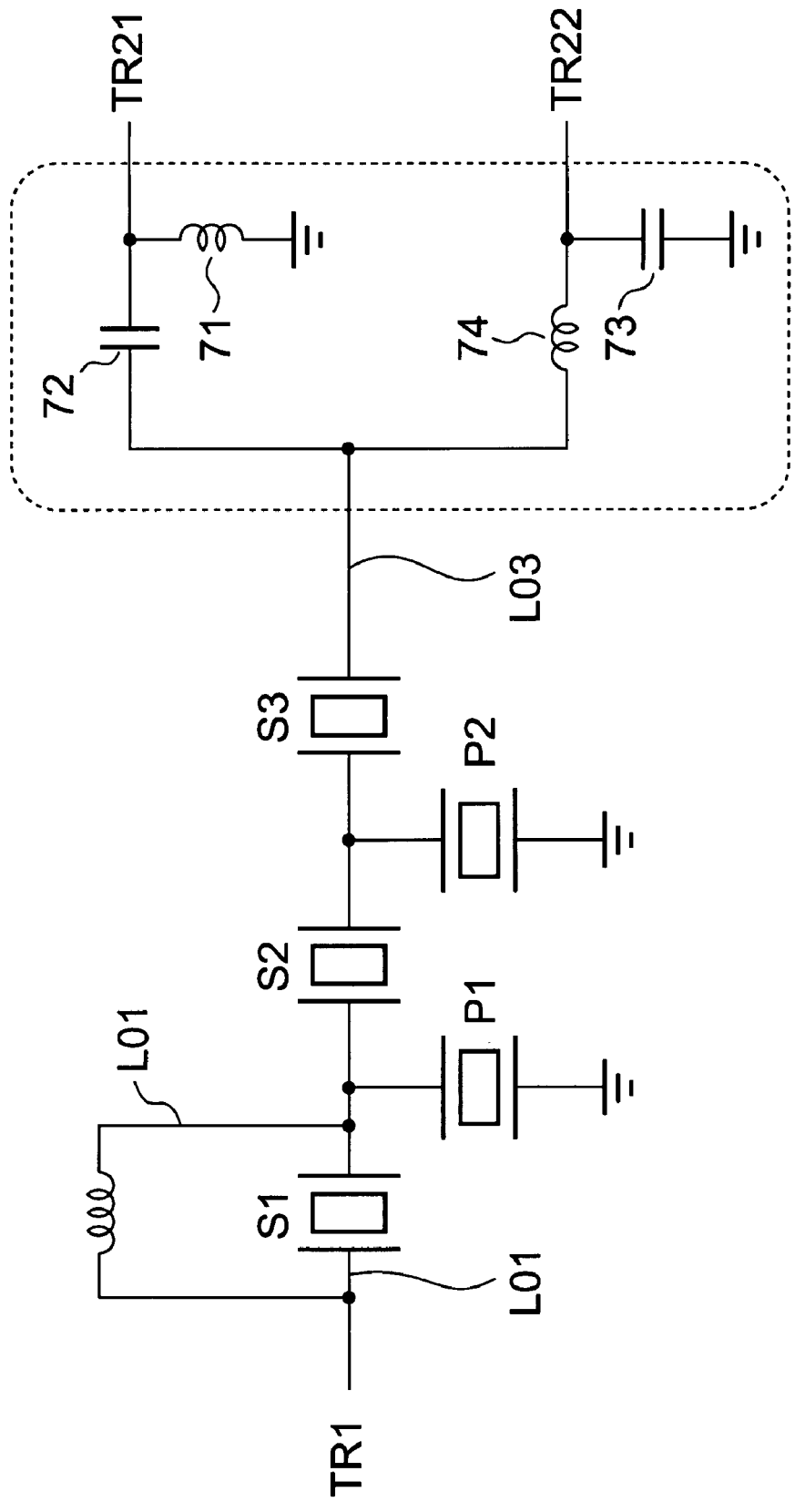
FIG. 28 is a circuit diagram of a duplexer in accordance with a ninth embodiment of the present invention.

A ninth embodiment of the present invention is an example case where the lumped parameter balun 70 is connected to the filter of the fifth embodiment. As shown in FIG. 28, the balun 70 is connected to the second line L03, and causes a second input/output terminal 1 TR21 and a second input/output terminal 2 TR22 to input or output signals with different phases from each other. In this manner, the balun 70 may be connected to the filter 10.

Figure 29:
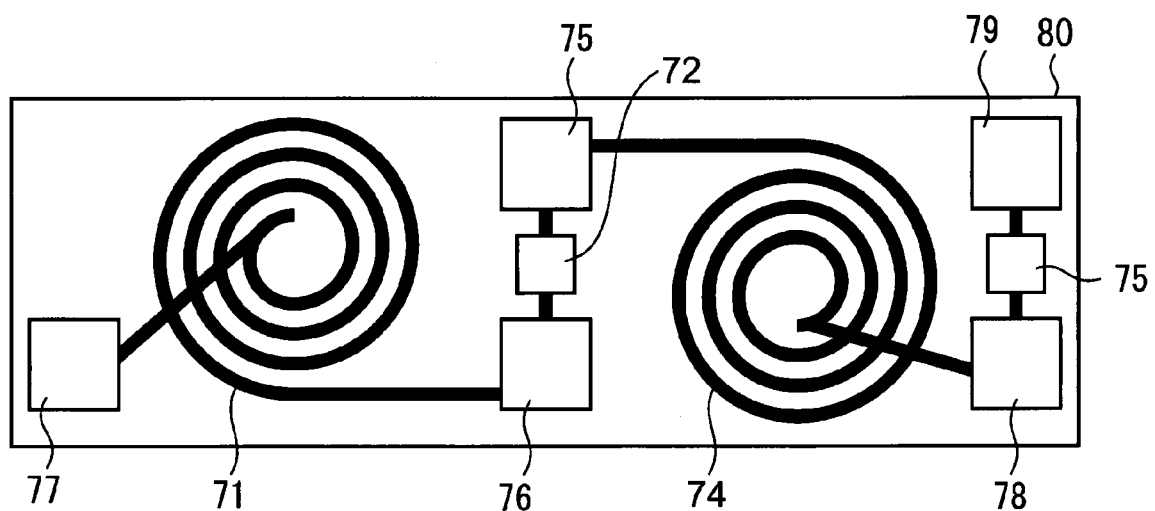
FIG. 29 shows an example case where an IPD is used for the balun.

FIG. 29 shows an example case where an IPD is used for the balun 70. As shown in FIG. 29, the capacitors 72 and 73, and the inductors 71 and 74 are formed on a quartz substrate 80, for example. Pads 75 are connected to the first line L01, pads 76 and 78 are connected to the second input/output terminals TR21 and TR22, and pads 77 and 79 are connected to the ground. As an IPD is used as the balun 70, a high-performance, small-sized device can be produced.

The capacitors and inductors that constitute the balun 70 may be chip capacitors and chip inductors. As chip devices are used for the balun 70, a high-performance, small-sized device can be produced.

In the first through ninth embodiments, surface acoustic wave resonators or piezoelectric thin-film resonators may be used as the series-arm resonators and the parallel-arm resonators including the first series-arm resonator S11 and the second series-arm resonator S21. Also, as the first inductor 30 and the second inductor 32 are formed with IPDs, a high-performance, small-sized device can be produced. With the first inductor 30 and the second inductor 32 being formed with chip inductors, a high-performance device can be produced at lower costs.

Finally, the present invention will be summarized in view of various aspects as follows.

According to an aspect of the present invention, there is provided a duplexer including: a first filter that is connected to a common terminal and a first terminal, and includes a first series-arm resonator; a second filter that is connected to the common terminal and a second terminal; a first inductor that is connected in parallel to the first series-arm resonator; a mounting unit that has the first filter and the second filter mounted thereon; a first inductor line that is provided on the mounting unit, and connects the first inductor and the first series-arm resonator; and a first terminal line that is provided on the mounting unit, and connects the first filter and the first terminal, the first inductor line and the first terminal line having currents flowing in directions that cross each other. It is thus possible to provide a duplexer that can reduce the mutual inductance between the first inductor line and the first terminal line, and have a high degree of suppression in the stop band of the first filter even if the size is made smaller.

The duplexer may further include: a first common line that is provided on the mounting unit, and connects the common terminal and the first filter, wherein the first common line and the first terminal line have currents flowing in directions that cross each other. With this structure, a duplexer that can reduce the mutual inductance between the first common line and the first terminal line, and have a high degree of suppression in the stop band of the first filter even if the size is made smaller can be provided.

The duplexer may be configured so that: the second filter includes a second series-arm resonator and a second inductor connected in parallel to the second series-arm resonator; the duplexer further comprises: a second inductor line that is provided on the mounting unit, and connects the second inductor and the second series-arm resonator; and a second terminal line that is provided on the mounting unit, and connects the second filter and the second terminal; and the second inductor line and the second terminal line have currents flowing in directions that cross each other. With this structure, a duplexer that can reduce the mutual inductance between the second inductor line and the second terminal line, and have a high degree of suppression in the stop band of the second filter even if the size is made smaller can be provided.

The duplexer may further include: a second common line that is provided on the mounting unit, and connects the common terminal and the second filter, wherein the second common line and the second terminal line have currents flowing in directions that cross each other. With this structure, a duplexer that can reduce the mutual inductance between the second common line and the second terminal line, and have a high degree of suppression in the stop band of the second filter even if the size is made smaller can be provided.

The duplexer may be configured so that: the first filter comprises a plurality of series-arm resonators including the first series-arm resonator; and the first series-arm resonator is located closest to the common terminal among the plurality of series-arm resonators including the first series-arm resonator. With this structure, a matching circuit becomes unnecessary.

The duplexer may be configured so that: the second filter comprises a plurality of series-arm resonators including the second series-arm resonator; and the second series-arm resonator is located closest to the common terminal among the plurality of series-arm resonators including the second series-arm resonator. With this structure, a matching circuit becomes unnecessary.

The duplexer may be configured so that an angle formed between the directions of currents flowing through the first inductor line and the first terminal line is in the range of 77.5 degrees to 102.5 degrees. With this structure, a duplexer that can have a higher degree of suppression in the stop band of the first filter can be provided.

The duplexer may be configured so that an angle formed between the directions of currents flowing through the first common line and the first terminal line is in the range of 77.5 degrees to 102.5 degrees. With this structure, a duplexer that can have a higher degree of suppression in the stop band of the first filter can be provided.

The duplexer may be configured so that an angle formed between the directions of currents flowing through the second inductor line and the second terminal line is in the range of 77.5 degrees to 102.5 degrees. With this structure, a duplexer that can have a higher degree of suppression in the stop band of the second filter can be provided.

The duplexer may be configured so that an angle formed between the directions of currents flowing through the second common line and the second terminal line is in the range of 77.5 degrees to 102.5 degrees. With this structure, a duplexer that can have a higher degree of suppression in the stop band of the second filter can be provided.

The duplexer may be configured so that: two of the first terminals are provided; and the duplexer further comprises a balun that is connected to the first terminal line, and causes the two first terminals to input or output signals having different phases from each other. With this structure, a duplexer that contains a balun for performing unbalanced-to-balanced conversion can be realized.

The duplexer may be configured so that the balun is formed with chip inductors and chip capacitors, or lumped parameter passive devices. The duplexer may be configured so that the first inductor is a chip inductor or a lumped parameter passive device. The duplexer may be configured so that the second inductor is a chip inductor or a lumped parameter passive device. The duplexer may be configured so that the first series-arm resonator is a surface acoustic wave resonator or a piezoelectric thin-film resonator. The duplexer may be configured so that the second series-arm resonator is a surface acoustic wave resonator or a piezoelectric thin-film resonator.

According to another aspect of the present invention, there is provided a filter including: a series-arm resonator that is connected between a first input/output terminal and a second input/output; an inductor that is connected in parallel to the series-arm resonator; a mounting unit that has the series-arm resonator mounted thereon; an inductor line that is provided on the mounting unit, and connects the inductor and the series-arm resonator; and a second line that is provided on the mounting unit, and connects the series-arm resonator and the second input/output terminal, wherein the inductor line and the second line have currents flowing in directions that cross each other. Thus, the mutual inductance between the inductor line and the second line is reduced, and a high degree of suppression can be achieved in the stop band of the filter, even if the size is made smaller.

The filter may further include: a first line that is provided on the mounting unit, and connects the series-arm resonator and the first input/output terminal, wherein the first line and the second line have currents flowing in directions that cross each other. With this structure, the mutual inductance between the first line and the second line is reduced, and a high degree of suppression can be achieved in the stop band of the filter, even if the size is made smaller.

The filter may be configured so that an angle formed between the directions of currents flowing through the inductor line and the second line is in the range of 77.5 degrees to 102.5 degrees. With this structure, a higher degree of suppression can be achieved in the stop band of the filter.

The filter may be configured so that an angle formed between the directions of currents flowing through the first line and the second line is in the range of 77.5 degrees to 102.5 degrees. With this structure, a higher degree of suppression can be achieved in the stop band of the filter.

The filter may be configured so that: two of the second input/output terminals are provided; and the filter further comprises a balun that is connected to the second line, and causes the two second input/output terminals to input or output signals having different phases from each other. With this structure, a filter that contains a balun for performing unbalanced-to-balanced conversion can be realized.

Although a few preferred embodiments of the present invention have been shown and described, it would be appreciated by those skilled in the art that changes may be made in these embodiments without departing from the principles and spirit of the invention, the scope of which is defined in the claims and their equivalents.

The present invention is based on Japanese Patent Application No. 2006-139597 filed on May 18, 2007, the entire disclosure of which is hereby incorporated by reference.

What is claimed is:

1. A duplexer comprising:
   a first filter that is connected to a common terminal and a first terminal, and includes a first series-arm resonator;
   a second filter that is connected to the common terminal and a second terminal;
   a first inductor that is connected in parallel to the first series-arm resonator;
   a mounting unit that has the first filter and the second filter mounted thereon;
   a first inductor line that is provided on the mounting unit, and connects the first inductor and the first series-arm resonator; and
   a first terminal line that is provided on the mounting unit, and connects the first filter and the first terminal,
   the first inductor line and the first terminal line having currents only flowing in directions that cross each other.

2. The duplexer as claimed in claim 1, further comprising:
   a first common line that is provided on the mounting unit, and connects the common terminal and the first filter,
   wherein the first common line and the first terminal line have currents only flowing in directions that cross each other.

3. The duplexer as claimed in claim 1, wherein:
   the second filter includes a second series-arm resonator and a second inductor connected in parallel to the second series-arm resonator;
   the duplexer further comprises:
   a second inductor line that is provided on the mounting unit, and connects the second inductor and the second series-arm resonator; and
   a second terminal line that is provided on the mounting unit, and connects the second filter and the second terminal; and
   the second inductor line and the second terminal line have currents only flowing in directions that cross each other.

4. The duplexer as claimed in claim 3, further comprising:
   a second common line that is provided on the mounting unit, and connects the common terminal and the second filter,
   wherein the second common line and the second terminal line have currents only flowing in directions that cross each other.

5. The duplexer as claimed in claim 1, wherein:
   the first filter comprises a plurality of series-arm resonators including the first series-arm resonator; and
   the first series-arm resonator is located closest to the common terminal among the plurality of series-arm resonators including the first series-arm resonator.

6. The duplexer as claimed in claim 3, wherein:
   the second filter comprises a plurality of series-arm resonators including the second series-arm resonator; and
   the second series-arm resonator is located closest to the common terminal among the plurality of series-arm resonators including the second series-arm resonator.

7. The duplexer as claimed in claim 1, wherein an angle formed between the directions of currents flowing through the first inductor line and the first terminal line is in the range of 77.5 degrees to 102.5 degrees.

8. The duplexer as claimed in claim 2, wherein an angle formed between the directions of currents flowing through the first common line and the first terminal line is in the range of 77.5 degrees to 102.5 degrees.

9. The duplexer as claimed in claim 3, wherein an angle formed between the directions of currents flowing through the second inductor line and the second terminal line is in the range of 77.5 degrees to 102.5 degrees.

10. The duplexer as claimed in claim 4, wherein an angle formed between the directions of currents flowing through the second common line and the second terminal line is in the range of 77.5 degrees to 102.5 degrees.

11. The duplexer as claimed in claim 1, wherein:
    two of the first terminals are provided; and
    the duplexer further comprises a balun that is connected to the first terminal line, and causes the two first terminals to input or output signals having different phases from each other.

12. The duplexer as claimed in claim 11, wherein the balun is formed with chip inductors and chip capacitors, or lumped parameter passive devices.

13. The duplexer as claimed in claim 1, wherein the first inductor is a chip inductor or a lumped parameter passive device.

14. The duplexer as claimed in claim 3, wherein the second inductor is a chip inductor or a lumped parameter passive device.

15. The duplexer as claimed in claim 1, wherein the first series-arm resonator is a surface acoustic wave resonator or a piezoelectric thin-film resonator.

16. The duplexer as claimed in claim 3, wherein the second series-arm resonator is a surface acoustic wave resonator or a piezoelectric thin-film resonator.

17. A filter comprising:
    a series-arm resonator that is connected between a first input/output terminal and a second input/output;
    an inductor that is connected in parallel to the series-arm resonator;
    a mounting unit that has the series-arm resonator mounted thereon;
    an inductor line that is provided on the mounting unit, and connects the inductor and the series-arm resonator; and
    a second line that is provided on the mounting unit, and connects the series-arm resonator and the second input/output terminal,
    wherein the inductor line and the second line have currents only flowing in directions that cross each other.

18. The filter as claimed in claim 17, further comprising:
    a first line that is provided on the mounting unit, and connects the series-arm resonator and the first input/output terminal,
    wherein the first line and the second line have currents only flowing in directions that cross each other.

19. The filter as claimed in claim 17, wherein an angle formed between the directions of currents flowing through the inductor line and the second line is in the range of 77.5 degrees to 102.5 degrees.

20. The filter as claimed in claim 18, wherein an angle formed between the directions of currents flowing through the first line and the second line is in the range of 77.5 degrees to 102.5 degrees.

21. The filter as claimed in claim 17, wherein:
two of the second input/output terminals are provided; and
the filter further comprises a balun that is connected to the second line, and causes the two second input/output terminals to input or output signals having different phases from each other.

* * * * *